US012672349B2

(12) United States Patent
Sharma et al.

(10) Patent No.: US 12,672,349 B2
(45) Date of Patent: Jun. 30, 2026

(54) DEVICE, METHOD AND SYSTEM TO PROVIDE AN INTERCONNECT BETWEEN CHANNEL STRUCTURES

(71) Applicant: Intel Corporation, Santa Clara, CA (US)

(72) Inventors: Abhishek Sharma, Portland, OR (US); Wilfred Gomes, Portland, OR (US); Tahir Ghani, Portland, OR (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 17/856,885

(22) Filed: Jul. 1, 2022

(65) Prior Publication Data

US 2024/0006415 A1     Jan. 4, 2024

(51) Int. Cl.
| | |
|---|---|
| *H10D 84/85* | (2025.01) |
| *H10D 30/01* | (2025.01) |
| *H10D 30/43* | (2025.01) |
| *H10D 30/67* | (2025.01) |
| *H10D 62/10* | (2025.01) |

(Continued)

(52) U.S. Cl.
CPC ......... *H10D 84/856* (2025.01); *H10D 30/014* (2025.01); *H10D 30/031* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 62/151* (2025.01); *H10D 84/0167* (2025.01); *H10D 84/017* (2025.01); *H10D 84/0186* (2025.01); *H10D 84/038* (2025.01); *H10D 88/01* (2025.01); *H10P 14/3462* (2026.01); *H10W 20/427* (2026.01); *H10W 40/47* (2026.01)

(58) Field of Classification Search
CPC ......... H10W 20/0696; H10W 20/0698; H10W 20/481; H10D 30/797; H10D 62/822; H10D 64/254; H10D 84/0149; H10D 84/83; H10D 88/00
USPC ....................................................... 257/351
See application file for complete search history.

(56) References Cited

U.S. PATENT DOCUMENTS

| | | |
|---|---|---|
| 5,028,988 A | 7/1991 | Porter et al. |
| 5,943,567 A | 8/1999 | Chang |

(Continued)

*Primary Examiner* — Fazli Erdem
(74) *Attorney, Agent, or Firm* — Essential Patents Group, LLP

(57) ABSTRACT

Techniques and mechanisms for providing an integrated circuit (IC) which comprises an interconnect that extends between channel structures of two transistors. In an embodiment, a separation layer is provided between a first stack of channel structures and a second stack of channel structures, wherein an interior region of the separation layer comprises a sacrificial material which spans on overlap region between the stacks. Fabrication processes form a hole which exposes the interior region, and etching is performed to remove the sacrificial material from the separation layer. Subsequently, deposition processing forms in the interior region a trace portion of the interconnect. In another embodiment, the interconnect comprises a contiguous body of a conductor material, wherein the contiguous body extends to form respective regions of the trace portion, and a via portion of the interconnect.

15 Claims, 15 Drawing Sheets

(51) Int. Cl.

| | |
|---|---|
| *H10D 62/13* | (2025.01) |
| *H10D 84/01* | (2026.01) |
| *H10D 84/03* | (2025.01) |
| *H10D 88/00* | (2026.01) |
| *H10P 14/20* | (2026.01) |
| *H10W 20/41* | (2026.01) |
| *H10W 40/47* | (2026.01) |

(56)     References Cited

U.S. PATENT DOCUMENTS

| | | | |
|---|---|---|---|
| 11,665,877 B1 | 5/2023 | Zhang et al. | |
| 12,191,270 B2 | 1/2025 | Wang et al. | |
| 2003/0227041 A1 | 12/2003 | Atwood et al. | |
| 2015/0019802 A1 | 1/2015 | Kamal et al. | |
| 2016/0049197 A1 | 2/2016 | Park et al. | |
| 2019/0348112 A1 | 11/2019 | Gopinath et al. | |
| 2020/0035683 A1 | 1/2020 | Sharma et al. | |
| 2020/0135266 A1 | 4/2020 | Kumar et al. | |
| 2020/0185392 A1 | 6/2020 | Makosiej et al. | |
| 2020/0257604 A1 | 8/2020 | Roh et al. | |
| 2021/0082776 A1 | 3/2021 | Wong et al. | |
| 2021/0257370 A1 | 8/2021 | Son | |
| 2021/0296445 A1 | 9/2021 | Lee et al. | |
| 2021/0358891 A1* | 11/2021 | Chuang | H01L 23/5286 |
| 2021/0366819 A1 | 11/2021 | Chiang et al. | |
| 2022/0013523 A1* | 1/2022 | Cheng | H10D 1/66 |
| 2022/0085161 A1 | 3/2022 | Noh et al. | |
| 2022/0093593 A1 | 3/2022 | Yang | |
| 2022/0130853 A1 | 4/2022 | Sharangpani et al. | |
| 2022/0190129 A1 | 6/2022 | Wei et al. | |
| 2022/0308995 A1 | 9/2022 | Gomes et al. | |
| 2022/0336474 A1 | 10/2022 | Liaw | |
| 2022/0359444 A1 | 11/2022 | Cantaloube et al. | |
| 2023/0056640 A1 | 2/2023 | Sharma et al. | |
| 2023/0067765 A1 | 3/2023 | Sharma et al. | |
| 2023/0085033 A1 | 3/2023 | Xie et al. | |
| 2023/0090092 A1* | 3/2023 | Lilak | H10D 62/121 |
| | | | 257/369 |
| 2023/0114024 A1 | 4/2023 | Gardner et al. | |
| 2023/0275067 A1 | 8/2023 | Sharma et al. | |
| 2023/0317146 A1 | 10/2023 | Sharma et al. | |
| 2023/0380194 A1 | 11/2023 | Chang et al. | |
| 2023/0385491 A1 | 11/2023 | Li | |
| 2023/0420371 A1 | 12/2023 | Radens et al. | |
| 2024/0222271 A1* | 7/2024 | Sharma | H10D 30/43 |

* cited by examiner

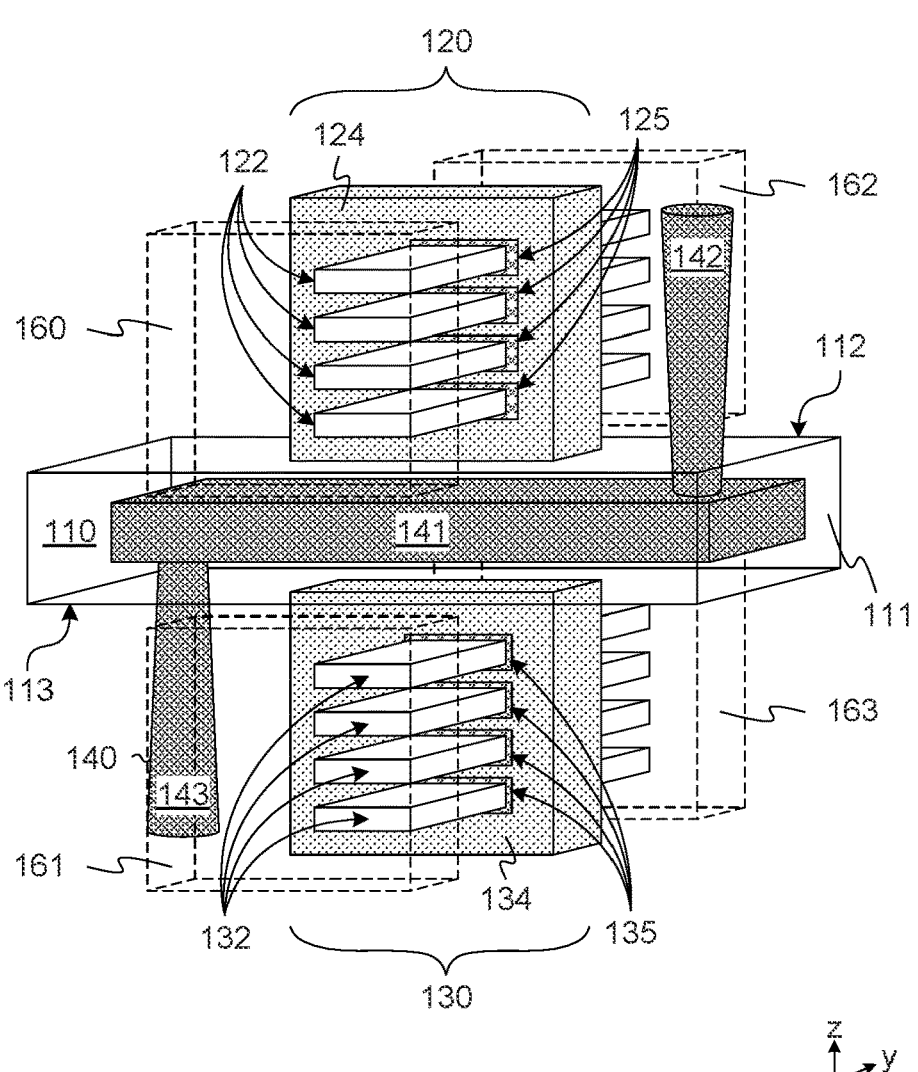
FIG. 1

300

301

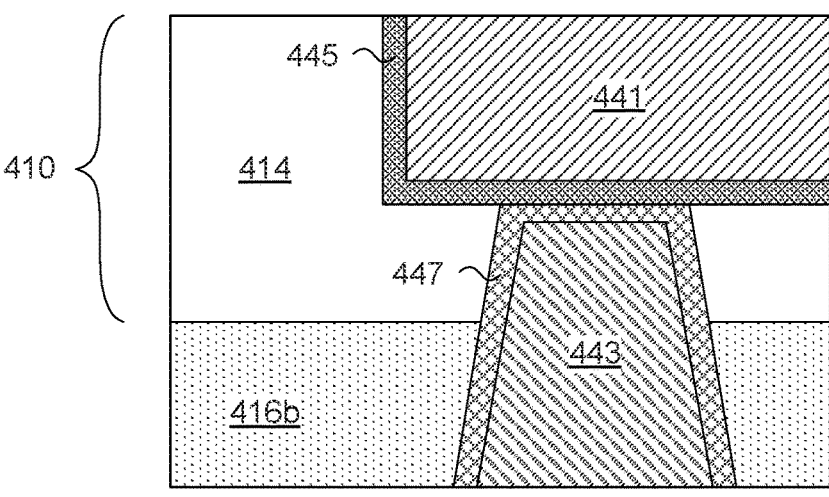
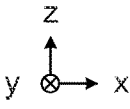
FIG. 4A
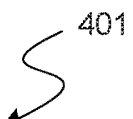
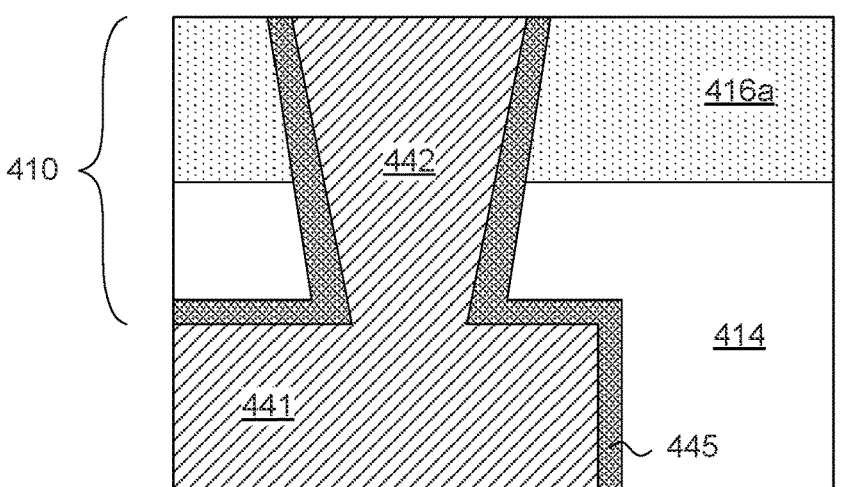
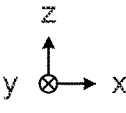
FIG. 4B

900

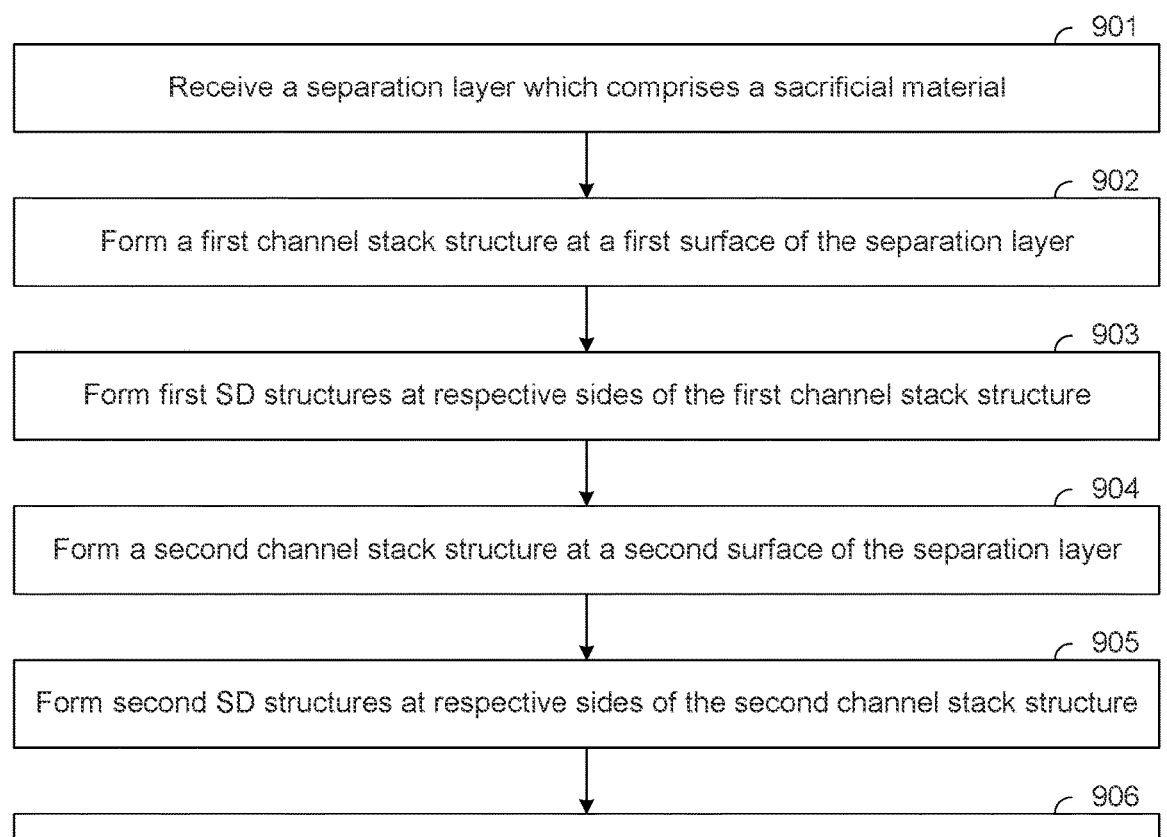

901

Receive a separation layer which comprises a sacrificial material

902

Form a first channel stack structure at a first surface of the separation layer

903

Form first SD structures at respective sides of the first channel stack structure

904

Form a second channel stack structure at a second surface of the separation layer

905

Form second SD structures at respective sides of the second channel stack structure

906

Form an interconnect structure comprising a via portion, and a trace portion which extends, within the separation layer between the first channel stack structure and the second channel stack structure, wherein forming the interconnect comprises replacing the sacrificial material with a conductive material of the trace portion

DEVICE, METHOD AND SYSTEM TO PROVIDE AN INTERCONNECT BETWEEN CHANNEL STRUCTURES

BACKGROUND

1. Technical Field

This disclosure generally relates to transistors and more particularly, but not exclusively, to a routing of interconnect structures in relation to transistor structures.

2. Background Art

There is an ongoing need for improved computational devices to enable ever increasing demand for modeling complex systems, providing reduced computation times, and other considerations. In some contexts, scaling features of integrated circuits has been a driving force for such improvements. Other advancements have been made in materials, device structure, circuit layout, and so on. In particular, there is an ongoing desire to further condense circuit structures which are included in or otherwise support operation of memory arrays—such as dynamic random access memory (DRAM) and static access memory (DRAM)—or other logic. It is with respect to these and other considerations that the present improvements have been needed. Such improvements may become critical as the desire to improve computational efficiency become even more widespread.

BRIEF DESCRIPTION OF THE DRAWINGS

The various embodiments of the present invention are illustrated by way of example, and not by way of limitation, in the figures of the accompanying drawings and in which:

FIG. 1 illustrates features of an integrated circuit die comprising interconnect structures which extend between channel stack structures according to an embodiment.

FIGS. 4A, 4B illustrate example structures of an integrated circuit die comprising a functional metallization layer between channel stack structures according to an embodiment.

FIG. 9 illustrates various processes or methods for forming a functional metallization layer between channel stack structures of an IC die according to an embodiment.

DETAILED DESCRIPTION

Figure 2A:
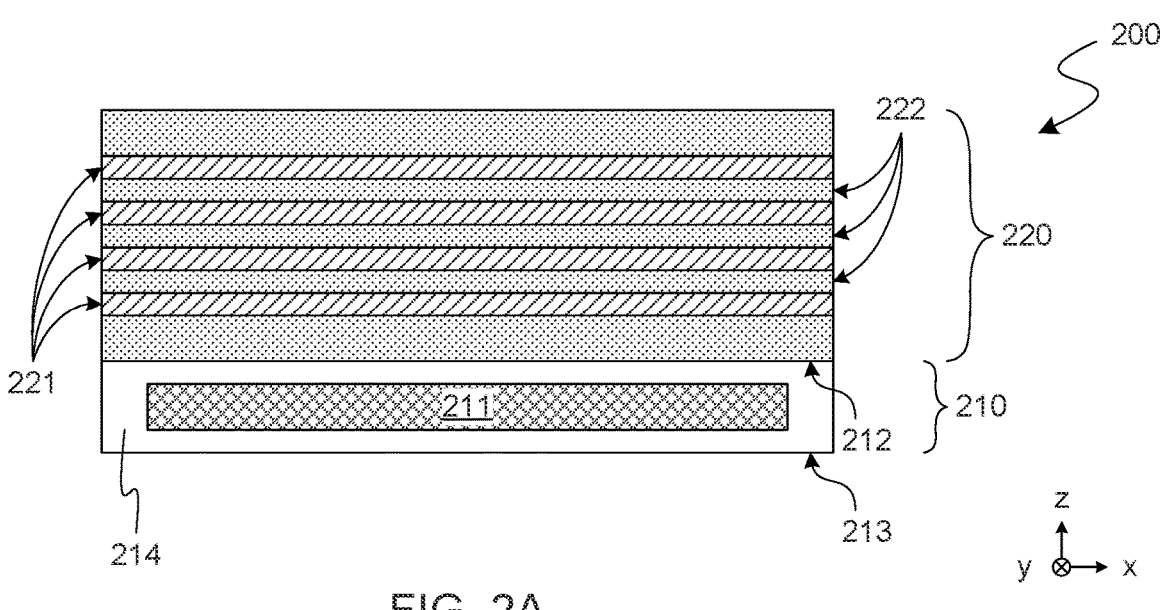
FIGS. 2A through 2H illustrate example structures as selected fabrication operations are performed according to an embodiment.

Embodiments discussed herein variously provide techniques and mechanisms for providing, at an integrated circuit (IC) die, a functional layer which includes an interconnect that extends between respective channel structures of transistors. Certain features of various embodiments are described herein with reference to IC fabrication wherein channel stack structures are formed on a separation layer which has disposed therein a sacrificial material that is to be replaced with a conductive material to form a trace portion of an interconnect. However, it is to be appreciated that such description can be extended to other embodiments which form in a separation layer an interconnect that extends between any of various additional or alternative types of transistor structures. For example, IC fabrication according to other embodiments comprises forming structures of a first transistor—e.g., the structures including a first one or more channel structures and a first one or more gate dielectric structures—on a first side of a separation layer. Furthermore, such IC fabrication comprises forming structures of a second transistor—e.g., the structures including a second one or more channel structures and a second one or more gate dielectric structures—on a second side of the separation layer. In one such embodiment, a sacrificial material in etched from the separation layer, and replaced with a conductive material to form, at least in part, an interconnect which extends between, and across a span of, the first and second transistors. Some embodiments provide an interconnect which extends between any of various planar transistors, non-planar transistors, or combinations thereof—e.g., including one or more FinFET transistors, one or more gate all around transistors (including nanowires, nanoribbons, etc.) or the like.

In some embodiments, an IC die comprises structures (referred to herein as "channel stack structures") which each include a respective stacked arrangement of channel structures. A given channel stack structure further comprises insulator structures which each extend between a respective two of the channel structures. A given channel structure (or, for brevity, simply "channel" herein) is operable, as a structure of a respective transistor, to selectively provide a conductive channel, between a source and drain of that transistor, based on a voltage at a gate of the transistor.

In one such embodiment, the IC die further comprises a layer (referred to herein as a separation layer) which extends between, adjoins, and provides at least some electrical insulation between, two channel stack structures. The insulation layer includes at least a portion of an interconnect which extends in a region between the two channel stack structures—e.g., wherein the two channel stack structures and the region variously overlap each other. Accordingly, some embodiments variously facilitate the communication of a signal or a voltage between two active regions—e.g., the communication across opposite respective sides of the two active regions.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including an integrated circuit comprising stacked channel structures and a separation layer therebetween.

FIG. 1 shows a perspective view diagram illustrating features of an integrated circuit (IC) die 100 which comprises interconnect structures according to an embodiment. IC die 100 illustrates one example of an embodiment wherein a separation layer extends between two channel stack structures, wherein an interconnect structure extends in the separation layer to facilitate electrical connection across the two channel stack structures.

As shown in FIG. 1, IC die 100 comprises a separation layer 110, and an upper device which extends to a surface 112 of separation layer 110, and a lower device which extends to a surface 113 of separation layer 110. Surfaces 112, 113 are on opposite respective sides of separation layer 110. A given one of the upper device or the lower device is—or otherwise comprises—a transistor, diode or other suitable active component which includes a stacked arrangement of channel structures. An insulation material 111 of separation layer 110 is, for example, a layer of oxide or nitride or other suitable insulator (e.g., silicon oxide, silicon nitride, or oxynitride, to name a few examples).

For example, the upper device comprises a channel stack structure 120 and—in some embodiments—source or drain (SD) regions 160, 162 (wherein a given source or drain region is to be at least part of as a respective one of a source or a drain) which are on opposite respective sides of channel stack structure 120. Channel stack structure 120 includes channels structures 122 (for brevity, also referred to herein as "channels") which are arranged in a stacked configuration with each other. In the example embodiment shown, channels 122 are nanoribbons of semiconductor material, wherein the nanoribbons which are in a vertical (z-axis) stack arrangement, relative to each other, along a direction which is in perpendicular to the surfaces 112, 113 of the separation layer 110. However, channels 122 are nanosheets, nanowires, and/or any of various other suitable channel structures, in other embodiments.

In some embodiments, channels 122 and/or channels 132 are instead arranged in a horizontal stack configuration—e.g., wherein the arrangement of channels 122, as compared to that shown, is instead turned 90 degrees along the y-axis. For example, channels 122 (or channels 132) are alternatively arranged, in a stacked configuration with each other, along a direction which is in parallel with the surfaces 112, 113 of the separation layer 110.

In an embodiment, each one of channels 122 comprises a respective semiconductor material which is configured to selectively conduct current between SC regions 160, 162. For example, the channel stack structure 120 further includes, or is otherwise structurally supported by, a gate structure 124 of the upper device. In one such embodiment, channel stack structure 120 further comprises one or more structures (such as the illustrative insulation structures 125 shown) which variously extend each between a respective two of the channels 122. By way of illustration and not limitation, insulation structures 125 include one or more gate dielectric structures which each surround a respective one or more of channels 122—e.g., wherein said one or more gate dielectric structures are to provide at least partial electrical insulation between a channel and gate structure 124. Conductivity between SC regions 160, 162 is controlled by the application of a voltage to gate structure 124. In some embodiments, portions of insulation structures 125, which are not shown, further extend to adjoin SD region 160 and SD region 162. In one such embodiment, the upper device further comprises gate spacer structures (not shown) which are variously disposed each between one of channels 122 and a respective one of SD regions 160, 162.

In various embodiments, the lower device at surface 113 includes one or more features similar to those of the upper device at surface 112. The lower device comprises a channel stack structure 130 and SD regions 161, 163 which, for example, provide functionality similar to that of channel stack structure 120 and SD regions 160, 162 (respectively). The channel stack structure 130 comprises a gate structure 134, channels 132, and insulation structures 135 which, for example, provide functionality similar to that of gate structure 124, channels 122, and insulation structures 125 (respectively).

In one such embodiment, various ones of channels 122, 132 each comprise a respective semiconductor material such as one of indium-gallium-zinc oxide (InGaZnO or IGZO), gallium oxide (GaO), zinc oxide (ZnO), indium oxide (InO), antimony oxide (SbO), copper oxide (CuO), indium antimony oxide (InSbO), aluminum zinc oxide (AlZnO), molybdenum disulfide ($MoS_2$), cadmium oxide (CdO), indium(III) oxide ($In_2O_3$), gallium(III) oxide ($Ga_2O_3$), tin(IV) oxide ($SnO_2$), indium zinc oxide (IZO), indium tin oxide (ITO), gallium zinc oxide (GZO), titanium dioxide ($TiO_2$), tin(II) oxide (SnO), cuprous oxide ($Cu_2O$), copper(II) oxide (CuO), vanadium(IV) oxide ($VO_2$), nickel/nickel(II) oxide (NiO), zinc rhodium oxide ($ZnRh_2O_4$), aluminum copper dioxide ($AlCuO_2$), strontium cuprate (SCO) ($SrCu_2O_2$), lanthanum selenium dioxide ($La_2SeO_2$), or other materials suitable for NMOS devices. Alternatively or in addition, various ones of channels 122, 132 each comprise a respective one of silicon (Si), silicon germanium (SiGe), germanium (Ge), or any of various other materials which are suitable for PMOS devices. In various embodiments, channels 122, 132 comprise the same materials or, in other embodiments, are compositionally different.

Additionally or alternatively, various ones of insulation structures 125, 135 each comprise any of various suitable gate dielectric material(s) such as, e.g., silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In some embodiments, some or all of SD regions 160-163 each comprise a respective epitaxially deposited crystalline materials, including, for example, any of various suitable semiconductor materials such as: silicon, SiGe, germanium, silicon carbide, silicon germanium carbide, germanium tin, silicon germanium tin, or other group IV materials; or gallium arsenide (GaAs), aluminum gallium arsenide (AlGaAs), indium gallium arsenide (InGaAs), or other group III-V based ternary and quaternary alloys. In some specific embodiments, SD regions 160-163 are formed of an epitaxial deposition such as, e.g., boron doped SiGe or germanium for PMOS, or phosphorus or arsenic-doped silicon for NMOS. In various embodiments, some or all of SD regions 160-163 further comprise contact structures including any of various suitable low resistivity metals such as, copper, ruthenium, tin, tungsten, aluminum, gold, silver, and platinum.

In some embodiments, gate spacers (not shown)—e.g., each variously between gate structure 124 and a respective one of SD regions 160, 162, or between between insulation structure 134 and a respective one of SD regions 161, 163—include, for example, an oxide material, a porous oxide material (which may have a lower k value), a silicon nitride, silicon dioxide, an oxynitride, a carbon-doped oxide, a carbon-doped oxynitride, or any of various other suitable insulator materials (or combinations thereof). Additionally or alternatively, gate structures 124, 134 are coupled to—or alternatively, include—respective gate electrodes (not shown) which, for example, comprise any of a wide range of suitable metals or metal alloys, such as, e.g., aluminum, tungsten, titanium, tantalum, copper, titanium nitride, or tantalum nitride.

To facilitate the provisioning of a signal and/or a voltage according to some embodiments, IC die 100 further comprises an interconnect structure 140, a portion of which extends in a horizontal direction (in the x-y plane shown) in a region which is between channel stack structure 120 and channel stack structure 130. Certain features of various embodiments are described herein with respect to an interconnect comprising a "trace portion" and at least one "via portion". As used herein, "trace portion" refers to an interconnect structure which extends between two opposing surfaces of a given layer (such as separation layer 110)—e.g., wherein the trace portion is oriented to facilitate communication of a signal or voltage primarily in a "horizontal" direction which is parallel to the opposing surfaces. By contrast, a "via portion" is an interconnect structure which extends in a "vertical" direction which is perpendicular to a surface of a layer—e.g., to communicate a signal or voltage to or from the layer. A given via portion of an interconnect extends through a via structure which is formed in a given layer—e.g., wherein the via structure comprises a hole which is formed by that layer. Unless otherwise indicated, the word "via" on its own—i.e., when not used as part of the term "via portion," or as part of the term "via structure"—is to be understood as referring herein to a via portion of an interconnect.

In the example embodiment shown, interconnect structure 140 comprises a trace portion 141—which is between surfaces 112, 113—and via portions 142, 143 which (for example) extend through surfaces 112, 113, respectively. By way of illustration and not limitation, some or all of portions 141, 142, 143 comprise copper (Cu), tungsten (W), titanium nitride (TiN), ruthenium (Ru), cobalt (Co), copper sulfide (Cu$_2$S) or any of various other suitable conductive materials. In an embodiment, a thickness (z-axis dimension) of the tract portion 141 is in a range of 0.5 nanometers (nm) to 20 nm.

In the example embodiment shown, trace portion 141 extends from the via portion 142 in a region of the separation layer 110 which is between channel stack structures 120, 130—e.g., wherein said region overlaps some or all of channel stack structure 130, and is overlapped by some or all of channel stack structure 120. Accordingly, interconnect structure 140 facilitates signal communication, or the provisioning of a voltage, across a horizontal span of channel structures 120, 130.

Although via portions 142, 143 are shown as extending through the opposite surfaces 112, 113 (respectively), in other embodiments, two via portions of interconnect structure 140 instead extend each through the same surface of separation layer 110. In some embodiments, IC die 100 further includes—or alternatively, accommodates coupling to—a source circuit and/or a sink circuit (not shown), wherein the source circuit is to provide a signal or a voltage to the sink circuit via interconnect structure 140. However, some embodiments are not limited to a particular type of signal or voltage which is provided by interconnect structure 140, and/or are not limited to a particular functionality that is provided by the source circuit (or by the sink circuit).

FIGS. 2A through 2H show various cross-sectional side views of structures each during a respective one of multiple stages 200-207 of processing to fabricate an integrated circuit according to an embodiment. Stages 200-207 illustrates one example of an embodiment which forms an interconnect structure in a separation layer between two channel stack structures. In various embodiments, processing such as that illustrated by stages 200-207 provides circuit structures such as those of IC die 100.

As shown in FIG. 2A, stage 200 comprises fabricating, receiving or otherwise providing a separation layer 210 which comprises both a insulation material 214 (such as insulation material 111) and a sacrificial material 211 which is disposed in an interior region of insulation material 214. In one such embodiment, providing separation layer 210 includes or is otherwise based on patterning, etching, deposition and/or other suitable fabrication processes which (for example) form a trench in insulation material 214, deposit the sacrificial material 211 in the trench, and (for example) polish a surface of the deposited sacrificial material 211. In some embodiments additional portions of the insulation material 214 are then deposited over sacrificial material 211—e.g., wherein the sacrificial material 211 is surrounded by the insulation material 214 in a horizontal (x-y) plane, and extends over and under sacrificial material 211 to form surfaces 212, 213 on opposite respective sides of separation layer 210.

In various embodiments, sacrificial material 211 is etch selective with respect to insulation material 214—e.g., wherein sacrificial material 211 and insulation material 214 comprise any of various suitable combinations of materials—e.g., including a nitride material and an oxide material, or an oxide material and another oxide material—which facilitate a later removal of sacrificial material 211 from within the interior region of insulation material 214. By way of illustration and not limitation, insulation material 214 and sacrificial material 211 comprise, respectively, hafnium oxide (HfO$_2$) and silicon oxide (SiO$_2$), in some embodiments. In other embodiments, insulation material 214 and sacrificial material 211 comprise silicon carbide (SiC) and silicon oxide (SiO$_2$), respectively. In still another embodiment, insulation material 214 and sacrificial material 211 comprise silicon nitride (SiN) and silicon oxide (SiO$_2$), respectively. In still another embodiment, insulation material 214 and sacrificial material 211 comprise silicon nitride (SiN) and silicon carbide (SiC), respectively.

In an embodiment, stage 200 further comprises growing, attaching or otherwise forming a superlattice 220 on surface 212 of separation layer 210. Superlattice 220 comprises an arrangement of alternating first layers (referred to herein as "active" layers) and second layers (referred to herein as "buffer" layers) which are to subsequently by processed to form various portions of a channel stack structure. By way of illustration and not limitation, superlattice 220 comprises active layers 221, some or all of which each comprise a respective semiconductor material which is to be further processed to provide a respective channel structure. In one such embodiment, superlattice 220 further comprises buffer layers 222, some or all of which are to provide a respective insulator structure, or (alternatively) are to be replaced—e.g., with gate dielectric structures, gate electrode structures, spacer structures and/or the like.

In one such embodiment, the active layers 221 are layers of silicon (Si), wherein the buffer layers 222 are layers of silicon germanium (SiGe) or, for example, of pure germanium (Ge). In an embodiment, the active layers 221 are layers of germanium (Ge), wherein the buffer layers 222 are layers of silicon germanium (SiGe). In still another embodiment, the active layers 221 are layers of indium gallium arsenide (InGaAs), wherein the buffer layers 222 are layers of indium arsenide (InAs). However, other suitable combinations of active layer materials and buffer layer materials are provided in different embodiments.

Figure 2B:
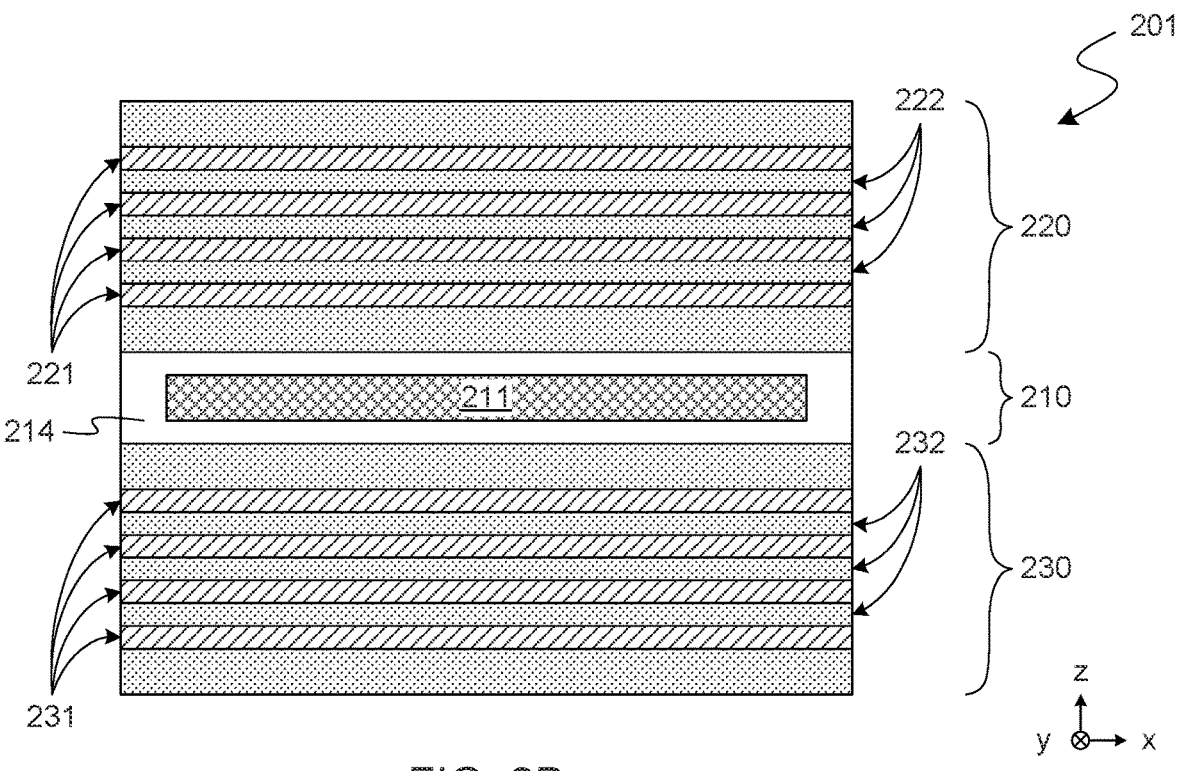

At stage 201, as shown in FIG. 2B, another superlattice 230 is attached to, or otherwise provided at, the opposite surface 213 of separation layer 210. In one such embodiment, the providing of superlattice 230 at surface 213 includes performing a wafer level transfer wherein (for example) the structures formed at stage 200 are attached to a carrier wafer, and inverted or otherwise repositioned to facilitate attachment of the superlattice 230 to surface 213. Coupling of superlattice 230 to surface 213 comprises operations which, for example, are adapted from various conventional wafer adhesion techniques, which are not detailed herein to avoid obscuring certain features of various embodiments.

Similar to superlattice 220, superlattice 230 comprises an interleaving arrangement of active layers 231 and buffer layers 232—e.g., wherein a first semiconductor material of active layers 221 is the same as (or alternatively, is different from) a second semiconductor material of active layers 231). Superlattices 220, 230 are to be subsequently processed each to variously form features of a different respective channel stack structure.

In some embodiments, formation of such channel stack structures comprises performing various additive operations and subtractive operations—e.g., comprising patterning, etching, and deposition processes—on one side of the assembly shown in stage 201, to form a first channel stack structure. After such formation, the partially processed assembly is inverted, and additional processing is performed on the opposite side to similarly form a second channel stack structure. In alternative embodiments, formation of the channel stack structures comprises alternately processing the opposite sides of the assembly, multiple times, in succession, to form the first and second channel structures concurrently.

Figure 2C:
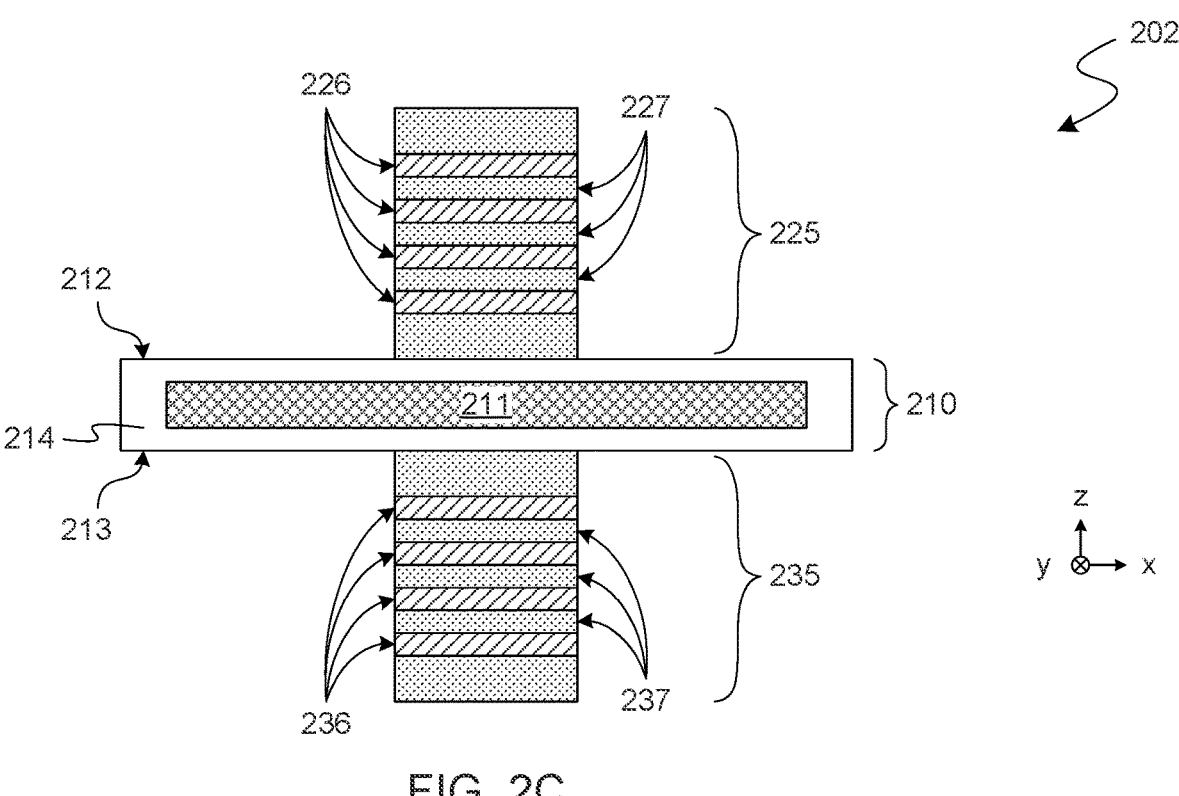

In the example embodiment illustrated by the stage 202 shown in FIG. 2C, superlattices 220, 230 are variously subjected to pattern, etch and/or other suitable processing to form, for example, a patterned superlattice structure 225 at surface 212, and another patterned superlattice structure 235 at surface 213 (respectively). As a result of such processing, superlattice structure 225 comprises remaining portions 226 of active layers 221, and remaining portions 227 of buffer layers 222—e.g., wherein superlattice structure 235 similarly comprises remaining portions 236 of active layers 231, and remaining portions 237 of buffer layers 232. In an embodiment, additional processing is to form, from portions 226 and 236, respective channels of a pair of channel stack structures (such as channel stack structure 120 and channel stack structure 130).

Figure 2D:
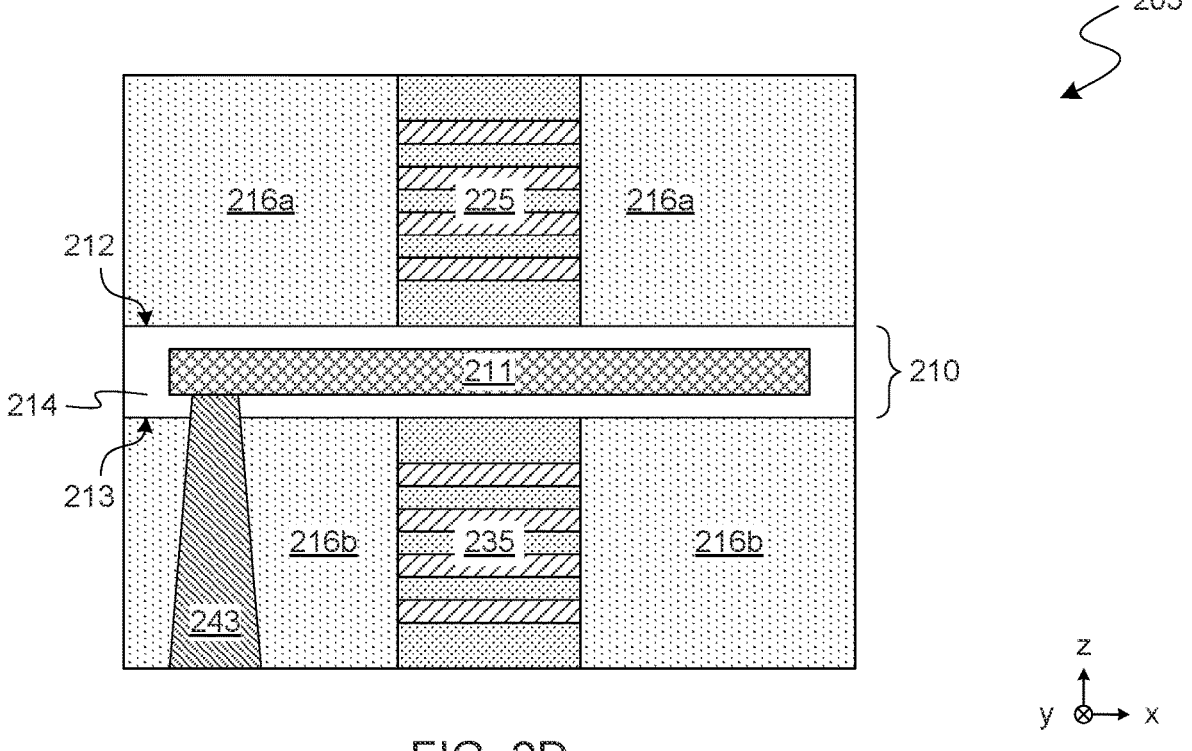

By way of illustration and not limitation, at the stage 203 shown in FIG. 2D, one or more insulator layers (illustrated as the example insulation structure 216a shown) are deposited on or otherwise formed at surface 212—e.g., in regions which adjoin superlattice structure 225. Alternatively or in addition, one or more insulator layers (illustrated as the example insulation structure 216b shown) are deposited on or otherwise formed at surface 213—e.g., in regions which adjoin superlattice structure 235.

In various embodiments, one or each of insulation structures 216a, 216b is formed from: (1) an oxide, such as silicon dioxide (SiO$_2$), aluminum oxide (Al$_2$O$_3$), or a carbon (C)-doped oxide; (2) a nitride, such as silicon nitride (Si$_3$N$_4$); (3) a polymer, such as perfluorocyclobutane or polytetrafluoroethylene; (4) a phosphosilicate glass (PSG); (5) a fluorosilicate glass (FSG); (6) an organosilicate glass (OSG), such as silsesquioxane or siloxane, carbosilane material (e.g., methyl- or ethyl-bridged silicates or carbosilane-ringed structures, such as 1,3,5-trisilacyclohexane derivatives); and/or (7) a combination of any one or more thereof. It should be noted, however, that the present disclosure is not so limited, as in a more general sense, and in accordance with some embodiments, insulation structures 216a, 216b are formed, in part or in whole, from any dielectric material (e.g., low-K dielectric, high-K dielectric, or otherwise), as desired for a given target application or end-use. In accordance with some embodiments, insulation structures 216a, 216b are formed, for example, using: (1) a physical vapor deposition (PROVIDE) process; (2) a chemical vapor deposition (CVD) process, such as plasma-enhanced CVD (PECVD); (3) a spin-on deposition (SOD) process; and/or (4) a combination of any one or more thereof. Other suitable materials and techniques for forming insulation structures 216a, 216b will depend on a given application and will be apparent in light of this disclosure.

Figure 2E:
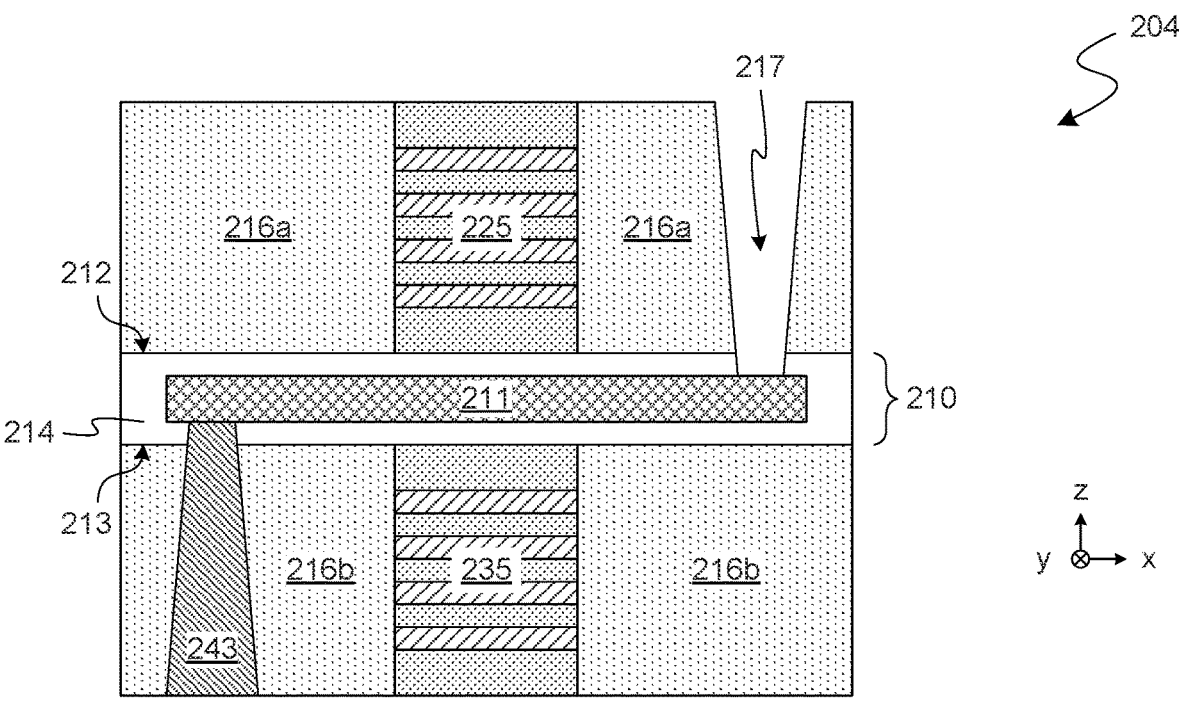

As illustrated by the stage 204 shown in FIG. 2E, additional fabrication—e.g., including any of various suitable pattern, etch and metallization processes—is performed to form one or more holes which each extend at least partially into insulation material 214 to expose sacrificial material 211. By way of illustration and not limitation, such additional fabrication results in a via portion 243 which (for example) extends vertically through insulation structure 216b and surface 213 to a side of sacrificial material 211 (where said side faces surface 213). In one such embodiment, the additional fabrication further results in a hole 217 which extends through insulation structure 216a and surface 212 to another side of sacrificial material 211 (where said other side faces surface 212).

In some embodiments, metallization processing to form via portion 243 comprises performing a patterned etch to form a hole structure which extends through insulation structure 216b and surface 213, and performing atomic layer deposition (ALD) or another suitable additive operation to form a conformal layer (not shown) of liner material along the walls of the hole structure. Subsequently, a metallization process is performed to deposit any of various suitable conductive materials on the liner layer—e.g., wherein via portion 243 includes the liner layer and the conductive material.

Figure 2F:
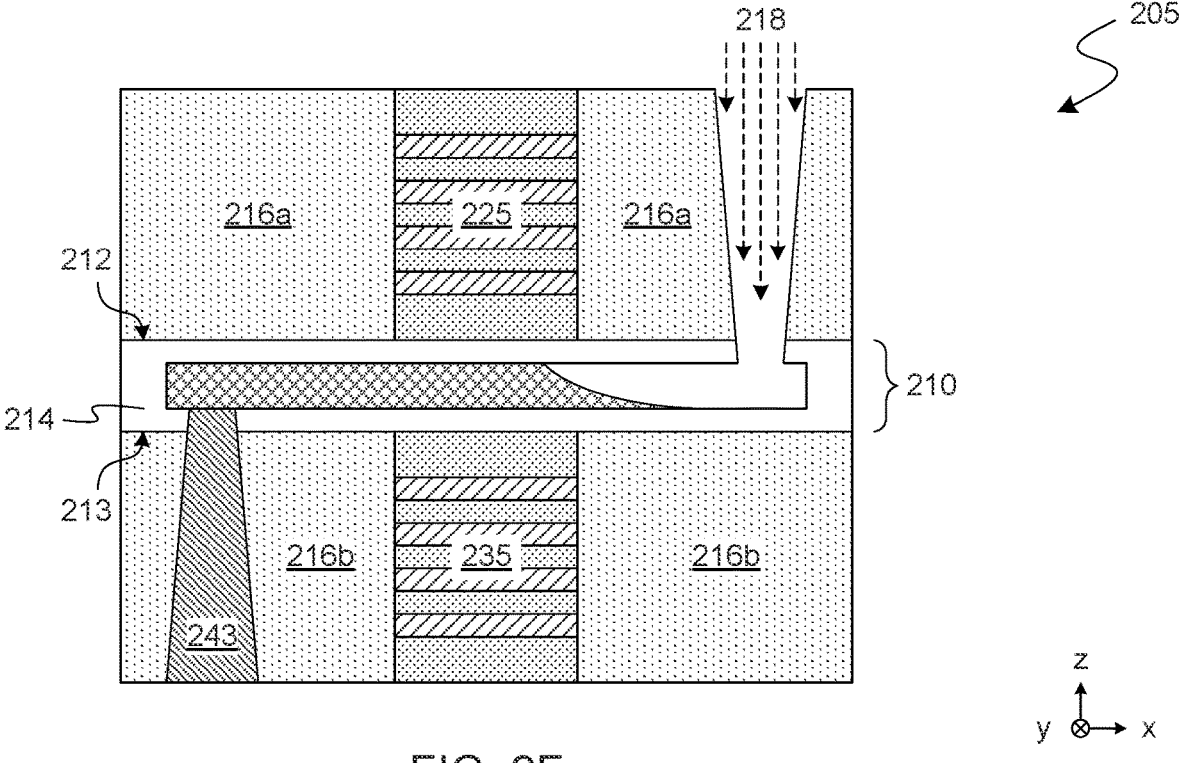

As illustrated by the stage 205 shown in FIG. 2F, etching 218—e.g., comprising any of various suitable wet etch operations—is performed through hole 217 to remove the sacrificial material 211 from an interior region 219 of the insulation material 214 of separation layer 210. Subsequently, additional processing is performed to form additional portions of the channel stack structures.

Figure 2G:
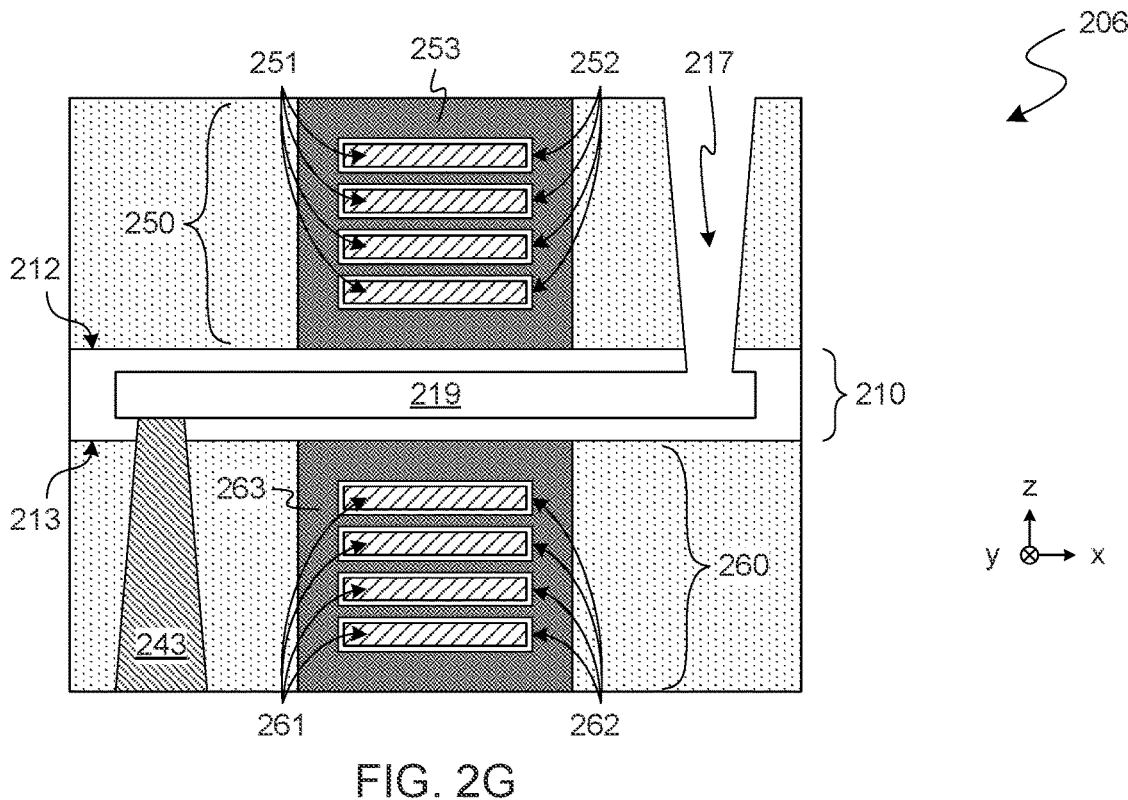

By way of illustration and not limitation, as illustrated by the stage 206 shown in FIG. 2G, additional pattern, etch and deposition processes are performed to provide on surface 212 a channel stack structure 250 which comprises channels 251, and insulation structures 252 which variously extend each between a respective two of the channels 251. In the example embodiment shown, insulation structures 252 are gate dielectrics which each extend around a corresponding one of the channels 251—e.g., wherein channels 251 each comprise some or all of a corresponding one of portions 226. In one such embodiment, channel stack structure 250 further includes, or is otherwise structurally supported by, a gate structure 253 which (for example) extends around and between insulation structures 252.

In one such embodiment, the additional processes further provide on surface 213 another channel stack structure 260 which comprises channels 261, and insulation structures 262 which variously extend each between a respective two of the channels 261. In the example embodiment shown, insulation structures 262 are gate dielectrics which each extend around a corresponding one of the channels 261—e.g., wherein channels 261 each comprise some or all of a corresponding one of portions 226. In one such embodiment, channel stack structure 260 further includes, or is otherwise structurally supported by, a gate structure 263 which (for example) extends around and between insulation structures 262. In various embodiments, formation of channel stack structures 250, 260 include operations which (for example) are adapted from conventional techniques for fabricating multi-channel transistor structures. Certain features of such conventional techniques are not detailed herein to avoid obscuring aspects of such embodiments.

Figure 2H:
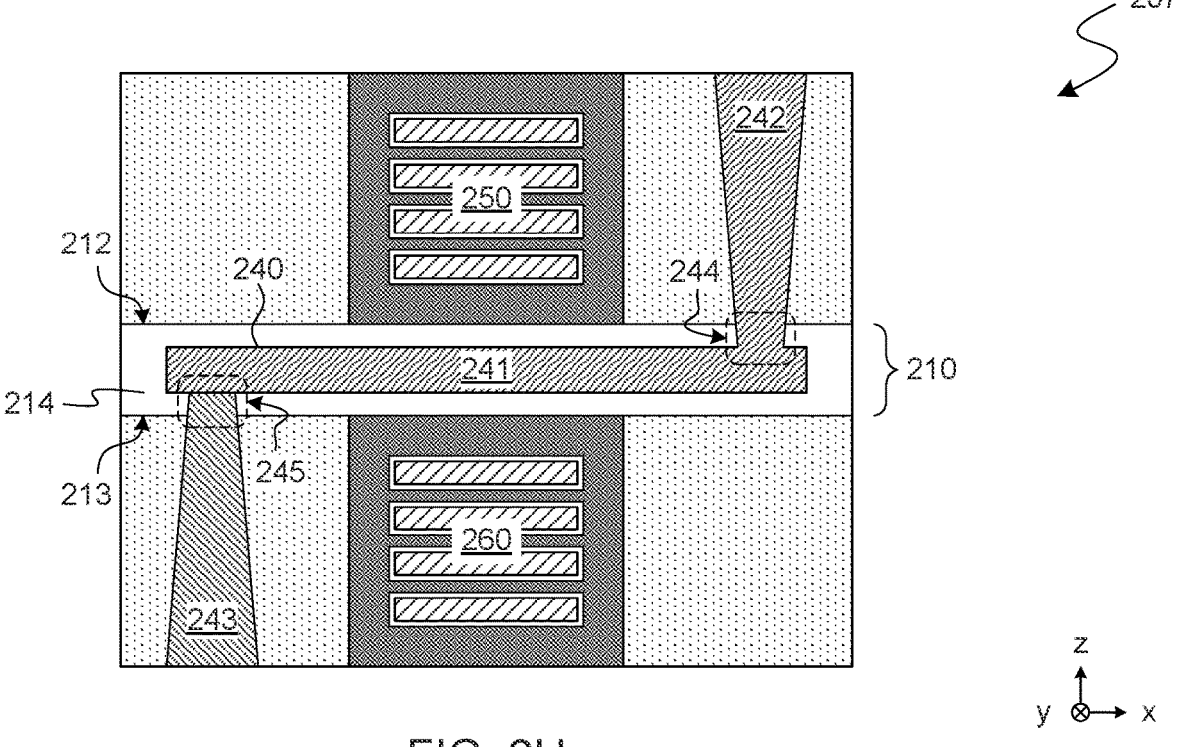

At the stage 207 in FIG. 2H, additional patterning, metallization and/or other processing is performed to provide an interconnect 240 which comprises the via portion 243, as well as a trace portion 241 and another via portion 242, wherein via portion 242 is disposed in hole 217, and wherein trace portion 241 extends horizontally in region 219—between channel stack structure 250 and channel stack structure 360—to each of via portions 242, 243.

In various embodiments, the processing to form trace portion 241 and via portion 242 comprises performing atomic layer deposition (ALD), chemical vapor deposition (CVD) or another suitable additive operation to introduce, through hole 217, a liner material which is deposited as a conformal layer (not shown) along the respective walls of the region 219 and hole 217. Subsequently, a metallization process is performed to further deposit, through hole 217 and into region 219, any of various suitable conductive materials on the liner layer. In one such embodiment, interconnect 240 comprises at least one liner layer of which—e.g., the illustrative region 244 shown—extends between a metal of trace portion 241 and a metal of via portion 243. By contrast, in various embodiments, a contiguous body of a conductive material extends from via portion 242, through region 244, to further form part of trace portion 241—e.g., wherein, in a horizontal (x-y) plane in region 244, a liner layer of interconnect 240 surrounds said contiguous body.

In some embodiments, channel stack structures 250, 260 provide functionality such as that of channel stack structures 120, 130 (respectively). In one such embodiment, channels 251, insulation structures 252, and gate structure 253 correspond functionally to channels 122, insulation structures 125, and gate structure 124 (respectively)—e.g., wherein channels 261, insulation structures 262, and gate structure 263 correspond functionally to channels 132, insulation structures 135, and insulation structure 134 (respectively). Furthermore, separation layer 210 provides functionality of separation layer 110—e.g., wherein surface 212, surface 213, and insulation material 214 correspond functionally to surface 112, surface 113, and insulation material 111 (respectively). Further still, interconnect 240 provides functionality such as that of interconnect structure 140—e.g., wherein trace portion 241, and via portions 242, 243 of interconnect structure 140 correspond to trace portion 141, via portion 142, and via portion 143 (respectively).

FIGS. 3A through 3F show various cross-sectional side views of structures each during a respective one of multiple stages 300-305 of processing to fabricate an integrated circuit according to another embodiment.

Stage 300-305 illustrates one example of an embodiment wherein an interconnect extends between—and to opposite respective sides of—two channel structures, wherein the interconnect comprises a contiguous body of a conductive material that extends in a trace portion and at least two via portions. In various embodiments, processing such as that illustrated by stages 300-305 provides circuit structures such as those of IC die 100.

Figure 3A:
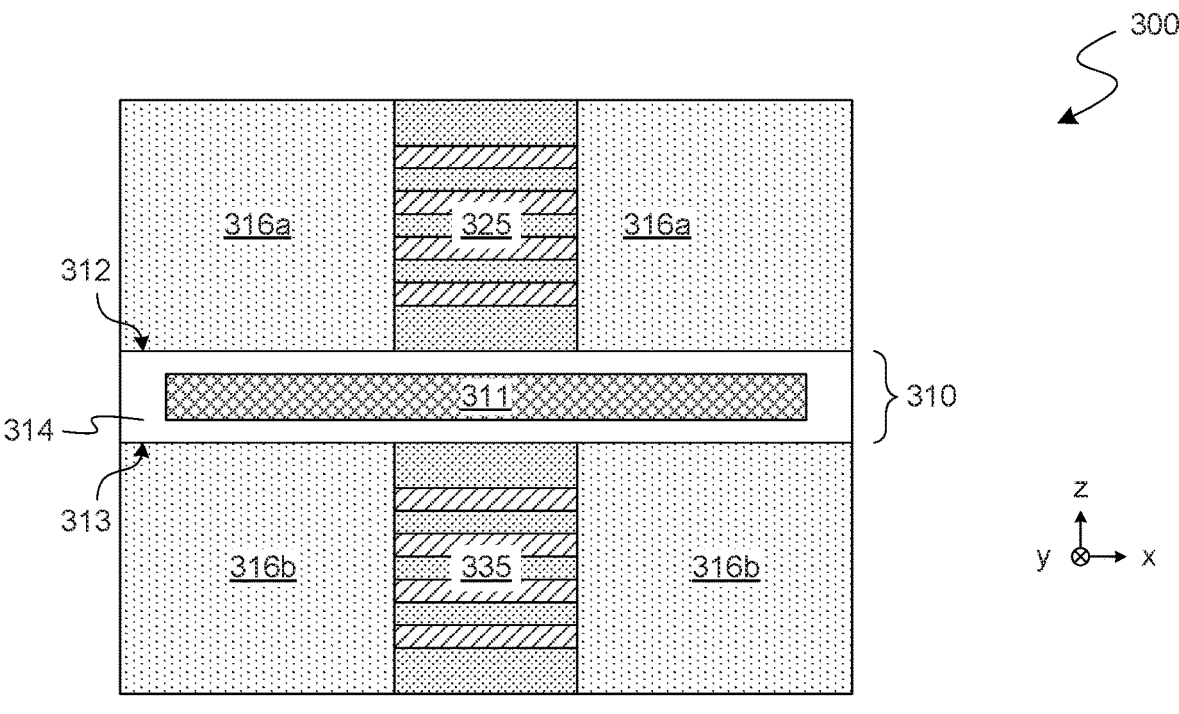
FIGS. 3A through 3F illustrate example structures as selected fabrication operations are performed according to an embodiment.

As shown in FIG. 3A, at stage 300, a separation layer 310 comprises an insulation material 314 and a sacrificial material 311 which is in an interior region of insulation material 314. Furthermore, superlattice structures 325, 335 are formed on opposing surfaces 312, 313 of separation layer 310, wherein an insulation structure 316a at surface 312 adjoins superlattice structure 325, and wherein another insulation structure 316b at surface 313 adjoins superlattice structure 335.

In various embodiments, stage 300 represents an alternative to the processing which is performed after stage 202. In one such embodiment, separation layer 310 provides functionality such as that of separation layer 210—e.g., wherein sacrificial material 311, insulation material 314, and surfaces 312, 313 correspond functionally to sacrificial material 211, insulation material 214, and surfaces 212, 213 (respectively). Alternatively or in addition, superlattice structures 325, 335 and insulation structures 316a, 316b correspond functionally to superlattice structures 225, 235 and insulation structures 216a, 216b (respectively). For example, superlattice structure 325 comprises an alternating arrangement of first active layer portions and first buffer layer portions (such as portions 226 and portions 227). Similarly, superlattice structure 335 comprises an alternating arrangement of second active layer portions and second buffer layer portions (such as portions 236 and portions 237).

Figure 3B:
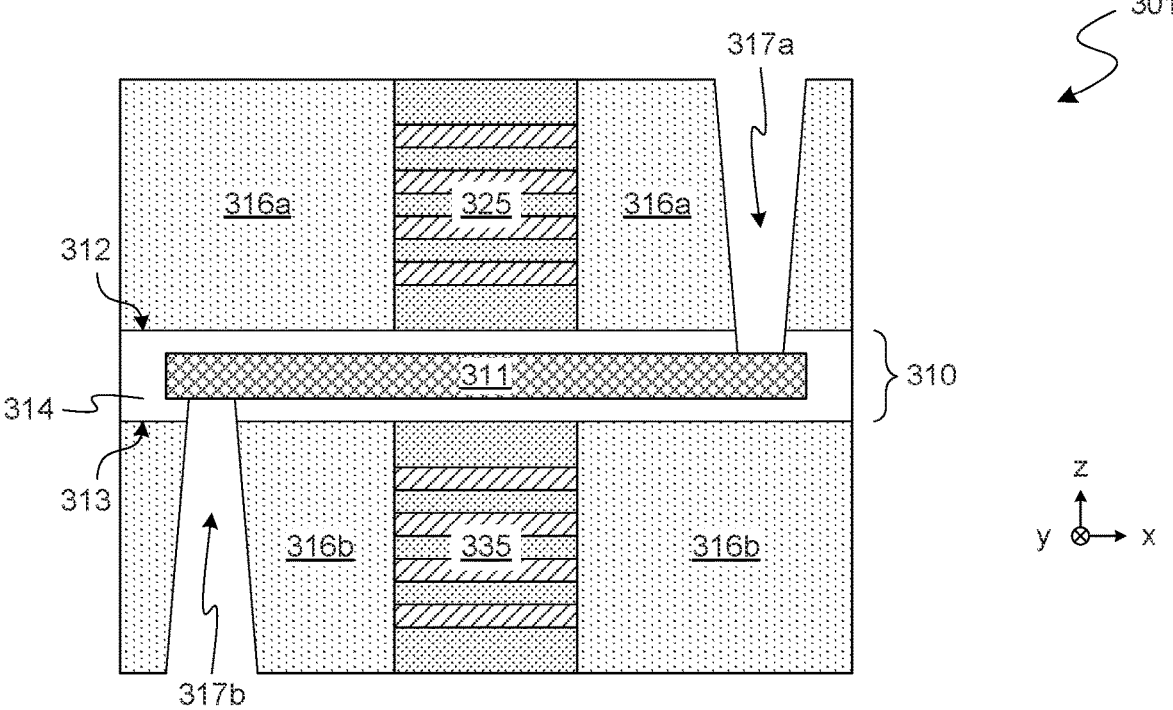

As illustrated by the stage 301 shown in FIG. 3B, additional fabrication—e.g., including any of various suitable pattern, etch and metallization processes—is performed to form one or more holes which each extend at least partially into insulation material 314 to expose sacrificial material 311. In one such embodiment, the additional fabrication further results in holes 317a, 317b which extend through insulation structures 316a, 316b (respectively), and surfaces 312, 313 (respectively) to sacrificial material 311.

Figures 3C, 3D:
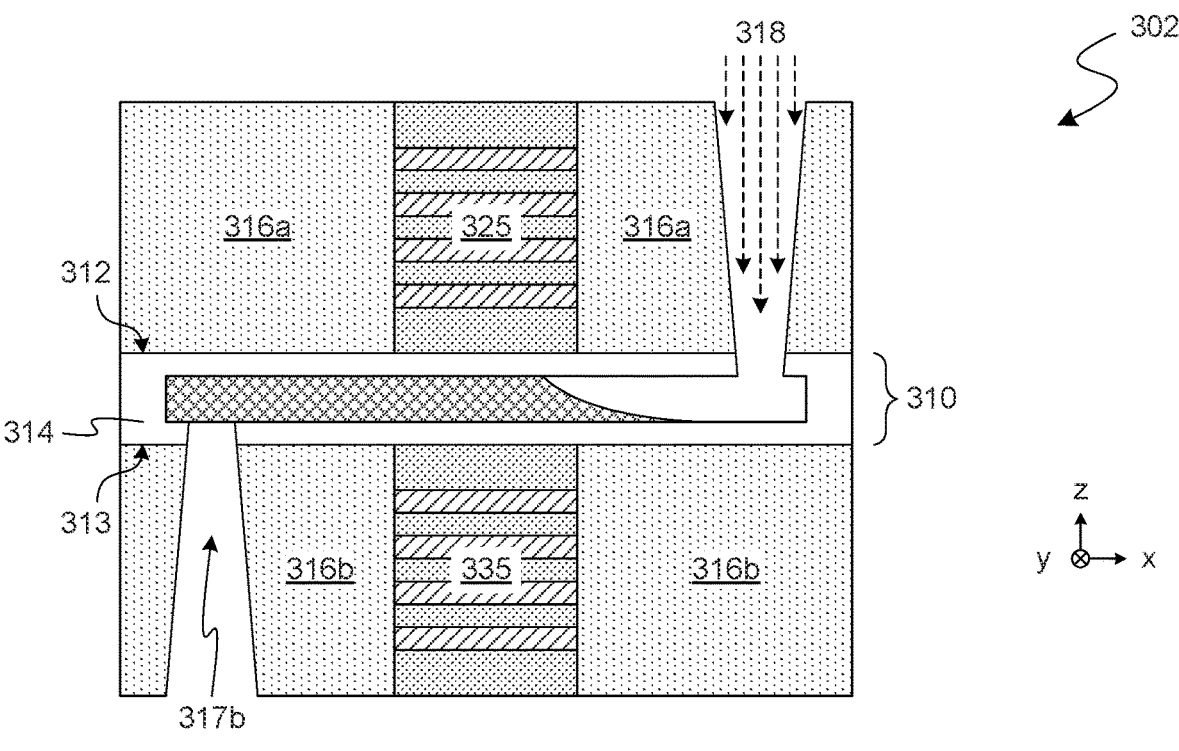

As illustrated by the stage 302 shown in FIG. 3C, etching 318—e.g., a wet etch operation—is performed through one or both of holes 317a, 317b to remove the sacrificial material 311. Due to the etching 318—as shown at stage 303 in FIG. 3D—an interior region 319 of the insulation material 314 is available to receive one or more conductive materials which are to form an interconnect which is to extend between (and through a horizontal span of) two channel stack structures. Subsequently, additional processing is performed to provide additional portions of said channel stack structures.

Figure 3E:
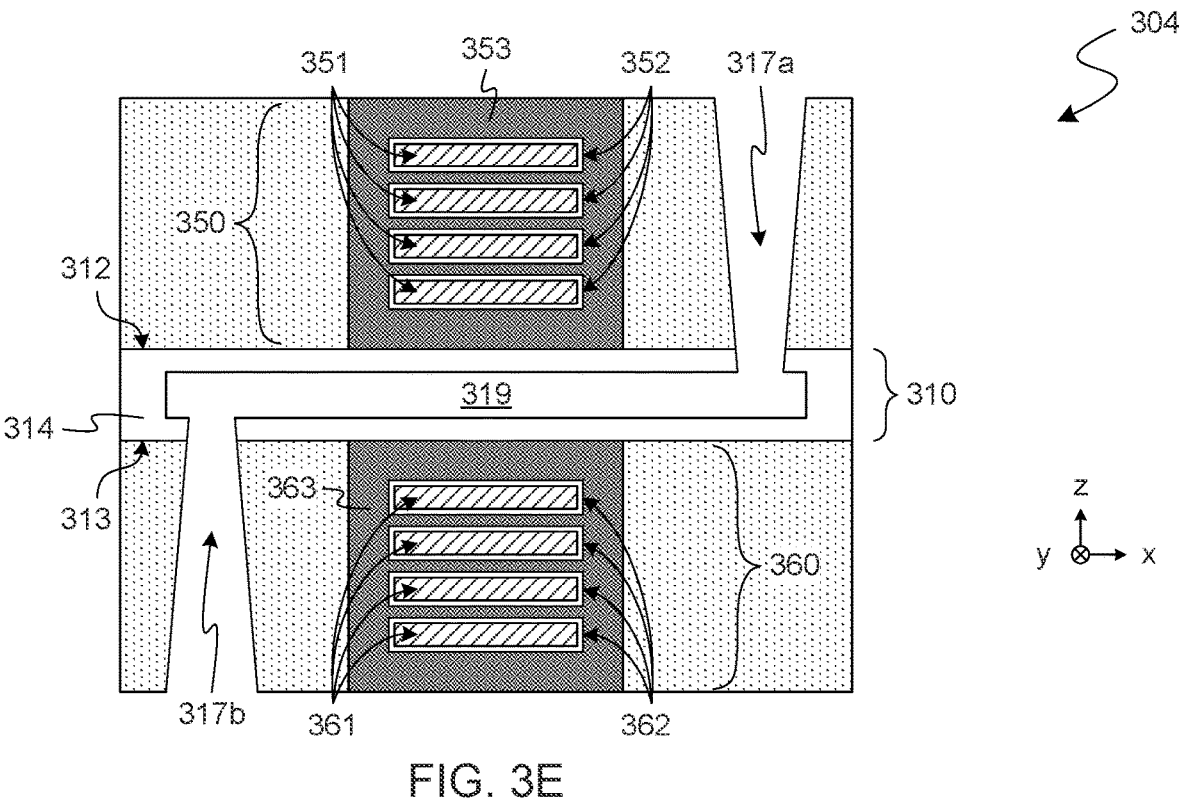

By way of illustration and not limitation, as illustrated by the stage 304 shown in FIG. 3E, additional pattern, etch and deposition processes are performed to provide on surface 312 a channel stack structure 350 which comprises channels 351, and insulation structures 352 each extend around a corresponding one of the channels 351. In one such embodiment, channel stack structure 350 further includes, or is otherwise structurally supported by, a gate structure 353 which (for example) extends around and between insulation structures 352.

Furthermore, the additional processes provide at surface 313 another channel stack structure 360 which comprises channels 361, and insulation structures 362 which variously extend each around a corresponding one of the channels 361. In one such embodiment, channel stack structure 360 further includes, or is otherwise structurally supported by, a gate structure 363 which (for example) extends around and between insulation structures 362. In various embodiments, formation of channel stack structures 350, 360 include features of the operations to provide channel stack structures 250, 260 (for example).

Figure 3F:
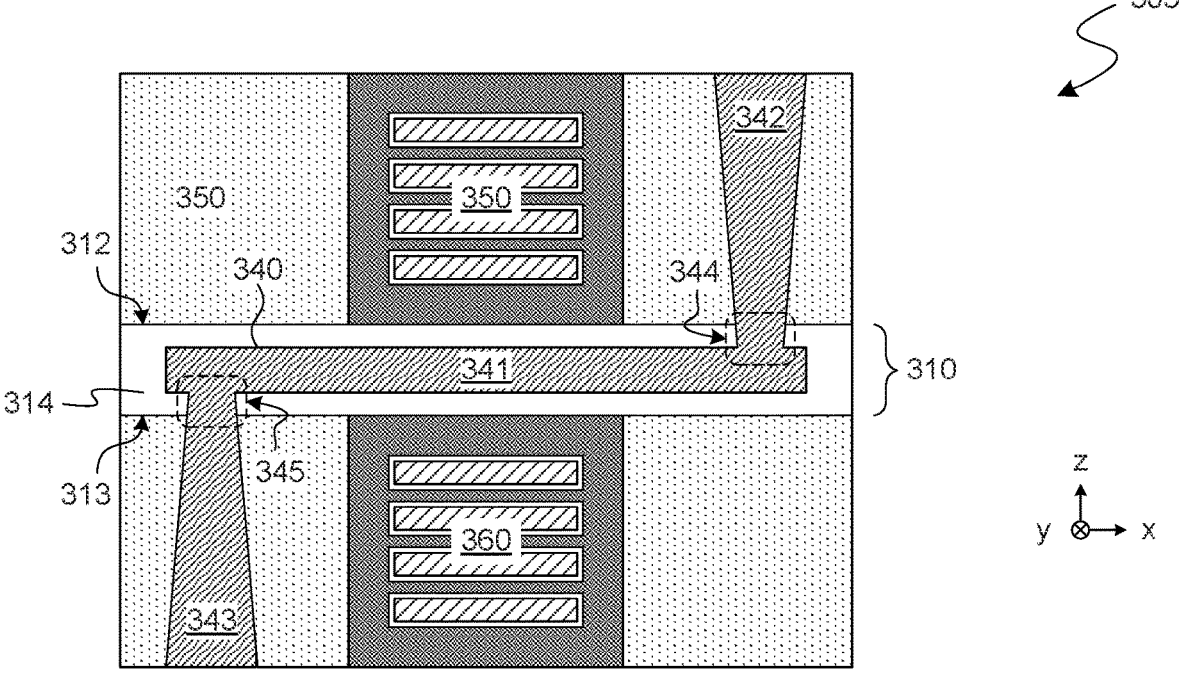

At the stage 305 in FIG. 3F, additional patterning, metallization and/or other processing is performed to provide an interconnect 340 which comprises the via portions 342, 343, as well as a trace portion 341 which extends horizontally in region 319—between channel stack structures 350—to each of via portions 342, 343.

In various embodiments, the processing to form interconnect 340 comprises performing atomic layer deposition (ALD), chemical vapor deposition (CVD) or another suitable additive operation to introduce, through one or both of holes 317a, 317b, a liner material which is deposited as a conformal layer (not shown) along the respective walls of the region 319 and holes 317a, 317b. Subsequently, a metallization process is performed to further deposit—through one or both of holes 317a, 317b and into region 319—any of various suitable conductive materials on the liner layer.

In an embodiment, a contiguous body of a conductive material extends from via portion 342, through region 344, to further form part of trace portion 341—e.g., wherein, in a horizontal (x-y) plane in region 344, a liner layer of interconnect 340 surrounds said contiguous body. In one such embodiment, such a contiguous body conductive material further extends from via trace portion 341, through region 345, to further form part of via portion 343—e.g., wherein, in a horizontal (x-y) plane in region 345, the liner layer again surrounds said contiguous body.

In some embodiments, channel stack structures 350, 360 provide functionality such as that of channel stack structures 120, 130 (respectively). In one such embodiment, channels 351, insulation structures 352, and gate structure 353 correspond functionally to channels 122, insulation structures 125, and gate structure 124 (respectively)—e.g., wherein channels 361, insulation structures 362, and gate structure 363 correspond functionally to channels 132, insulation structures 135, and insulation structure 134 (respectively). Furthermore, separation layer 310 provides functionality of separation layer 110—e.g., wherein surface 312, surface 313, and insulation material 314 correspond functionally to surface 112, surface 113, and insulation material 111 (respectively). Further still, interconnect 340 provides functionality such as that of interconnect structure 140—e.g., wherein trace portion 341, and via portions 342, 343 of interconnect structure 140 correspond to trace portion 141, via portion 142, and via portion 143 (respectively).

FIG. 4A shows a cross-sectional side view of an IC die 400 which includes an interconnect and channel stack structures according to a corresponding embodiment. IC die 400 illustrates one example of an embodiment wherein one or more liner structures each extend between respective conductive materials of a trace portion and a via portion of an interconnect which extends between two channel stack structures. In various embodiments, IC die 400 provides functionality such as that of IC die 100—e.g., wherein structures of IC die 400 are provided with processing such as that illustrated by stages 200-207.

As shown in FIG. 4A, IC die 400 comprises a separation layer 410 which (for example) corresponds functionally to separation layer 110 or separation layer 210. Separation layer 410 comprises an insulation material 414—such as insulation material 111 or insulation material 214—which extends between two channel stack structures (not shown). An insulation structure 416b—such as insulation structure 216b, for example—is provided at one side of separation layer 410 to facilitate electrical insulation and/or structural support for at least one of the channel stack structures. In one illustrative embodiment, the structures shown in FIG. 4A are those in region 245 (for example).

In an embodiment, IC die 400 further comprises an interconnect (such as one of interconnects 140, 240) which includes a first via portion and a trace portion which extends to the first via portion. The first via portion comprises a liner structure 447 which is formed on sidewall structures of a hole extending through both insulation structure 416b, and a portion of insulation material 414. Furthermore, the first via portion comprises a portion of a conductor 443 which is within the hole—e.g., wherein liner structure 447 surrounds conductor portion 443 in a horizontal (x-y) plane, and extends over a distal end of conductor portion 443. The trace portion comprises at least some of another liner structure 445 which is disposed on interior sidewall structures formed by insulation material 414. Furthermore, the trace portion comprises at least a portion of a conductor 441—e.g., wherein, within insulation material 414, liner structure 445 surrounds conductor portion 441 both in a horizontal (x-y) plane and in a vertical (z-y) plane.

In an illustrative embodiment, a given one of liner structures 445, 447 comprises any of various barrier layer refractory metals and alloys, such as molybdenum, nickel, cobalt, cobalt-nickel (CoNi), titanium-tungsten (Ti), tantalum (Ta), tantalum-nitride (TaN), tantalum-silicon-nitride (TaSiN), titanium-nitride (TiN), titanium-silicon-nitride (TiSiN), tungsten (XV), tungsten-nitride (WN), tungsten-silicon-nitride (WiSiN), and combinations of such materials (e.g., a multi-lay stack of Ta/TaN). Suitable well-known deposition techniques such as CVD, Atomic Layer Deposition (ALD), or Physical Vapor Deposition (PROVIDE) may be used to deposit these various materials.

FIG. 4B shows a cross-sectional side view 401 of a region of IC die 400 (other than the region shown in FIG. 4A). As shown in view 401, IC die 400 further comprises another insulation structure 416a, at another side of separation layer 410, to facilitate electrical insulation and/or structural support for another one of the channel stack structures. In one illustrative embodiment, the structures shown in FIG. 4B are those in one of regions 244, 344 or 345 (for example).

In some embodiments, the interconnect of IC die 400 further comprises a second via portion which extends to trace portion. In one such embodiment, the second via portion comprises another part of liner structure 445, wherein said other part is formed on sidewall structures of a hole which extends through both insulation structure 416a, and an upper portion of insulation material 414. Furthermore, the second via portion comprises another portion 442 of the contiguous body of conductive material which also includes conductor portion 441. Accordingly, in various embodiments, one or more liner structures each extend between two bodies, each of a respective conductive material, at a region where a trace portion extends to a via portion. In one such embodiment, a contiguous body of a conductive material extends to form, at least in part, each of a trace portion and a via portion of an interconnect—e.g., wherein any liner structure of the interconnect does not extend between said trace portion and said via portion. In some embodiments, a contiguous body of a conductive material forms at least part of a trace portion, and further extends to form respective parts of two via portions, wherein any liner structure of the interconnect does not extend between the trace portion and either of the via portions.

Figure 5:
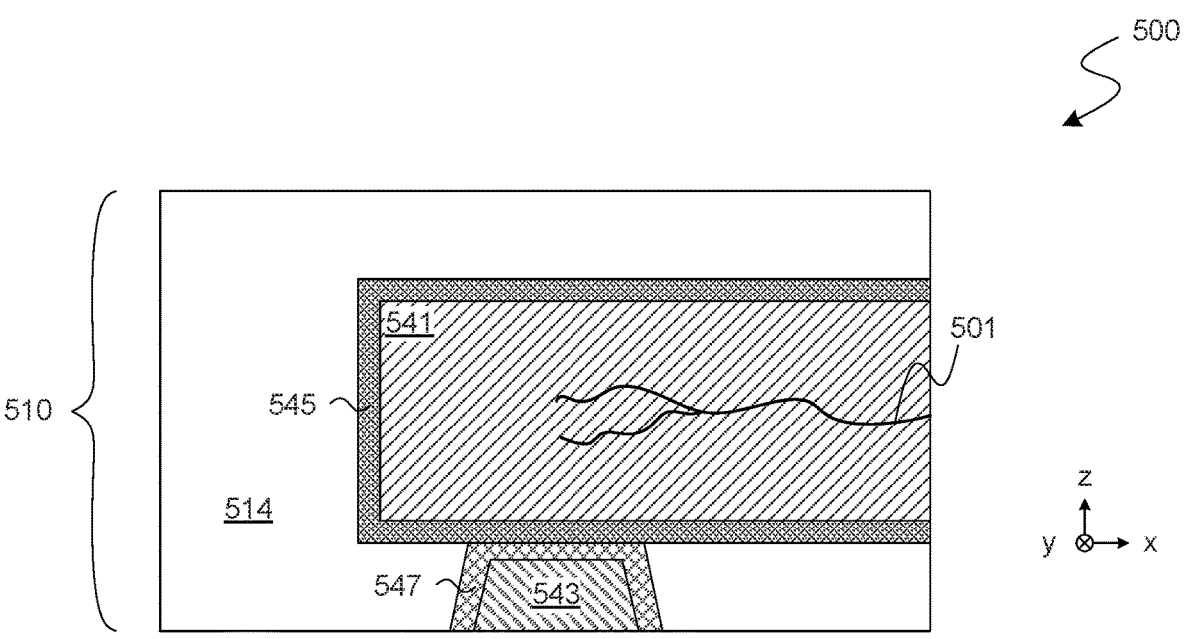
FIGS. 5 and 6 illustrate features of respective integrated circuit dies each comprising interconnect structures according to a corresponding embodiment.

FIG. 5 shows a cross-sectional side view of an IC die 500 comprising interconnect structures and channel stack structures according to an embodiment. IC die 500 illustrates one example of an embodiment wherein an interconnect, which extends between two channel stack structures, exhibits metallurgical features which are an artefact of fabrication processes described herein. In various embodiments, IC die 500 provides functionality such as that of IC die 100— e.g., wherein structures of IC die 500 are provided with processing such as that illustrated by stages 200-207 (or by stages 300-305).

As shown in FIG. 5, IC die 500 comprises a separation layer 510 which (for example) corresponds functionally to one of separation layers 110, 210, 410. Separation layer 510 comprises an insulation material 514—such as insulation material 111 or insulation material 214—which extends between two channel stack structures (not shown). In an embodiment, IC die 500 further comprises an interconnect (such as one of interconnects 140, 240) which includes a via portion and a trace portion which extends to the via portion. The via portion comprises a liner structure 547 which is formed on sidewall structures of a hole extending through a portion of insulation material 514. Furthermore, the via portion comprises a portion of a conductor 543 which is within the hole. The trace portion comprises at least some of another liner structure 545 which is disposed on interior sidewall structures formed by insulation material 514. Furthermore, the trace portion comprises at least a portion of a conductor 541—e.g., wherein, within insulation material 514, liner structure 545 surrounds conductor portion 541 both in a horizontal (x-y) plane and in a vertical (z-y) plane.

In one such embodiment, the trace portion 541 has formed therein one or more seam structures (such as the illustrative seam structure 501 shown) which are formed where the respective boundaries of different grain regions meet. By way of illustration and not limitation, seam structure 501 is formed by grain regions variously growing toward each other from different interior sidewall structures of insulation material 514.

Figure 6:
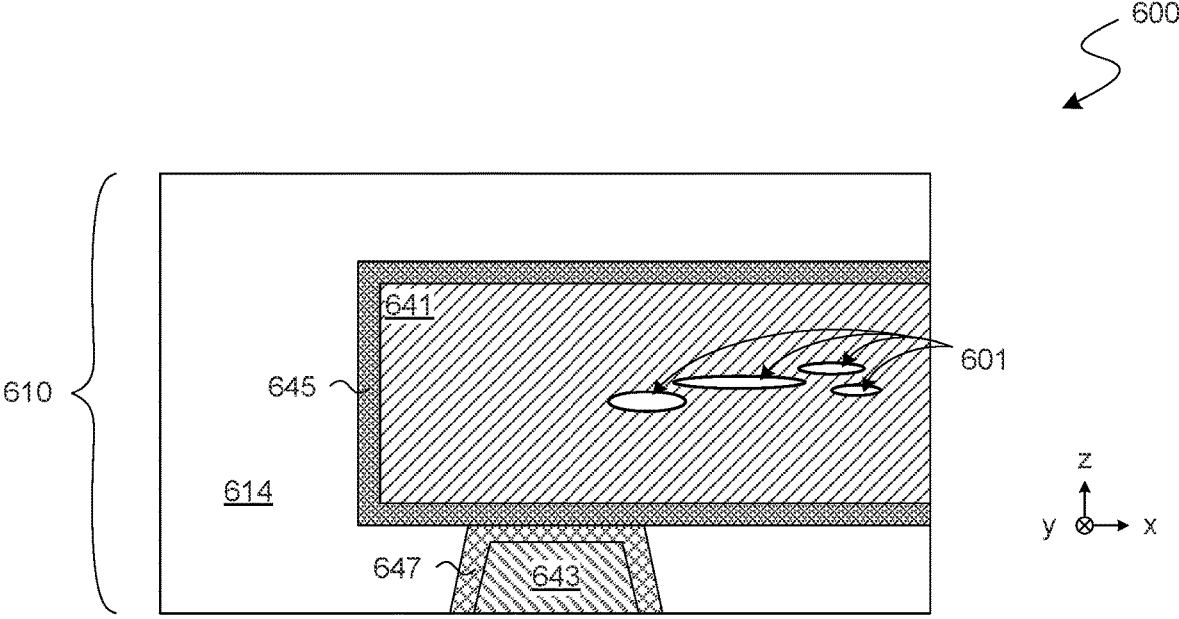

FIG. 6 shows a cross-sectional side view of an IC die 600 comprising interconnect structures and channel stack structures according to another embodiment. IC die 600 illustrates one example of an embodiment wherein an interconnect, which extends between two channel stack structures, has formed therein void structures which are an artefact of fabrication processes described herein. In various embodiments, IC die 600 provides functionality such as that of IC die 100—e.g., wherein structures of IC die 600 are provided with processing such as that illustrated by stages 200-207 (or by stages 300-305).

As shown in FIG. 6, IC die 600 comprises a separation layer 610 which includes an insulation material 614. Furthermore, an interconnect of IC die 600 comprises conductor portions 641, 643 and liner structures 645, 647 which (for example) correspond functionally to conductor portions 541, 543 and liner structures 545, 547. In one such embodiment, the trace portion has formed therein one or more void structures (such as the illustrative void structures 601 shown) which are formed within one or more grain regions of conductor portion 541. By way of illustration and not limitation, void structures 601 are formed as grain regions variously grow toward each other from different interior sidewall structures of insulation material 614. In this particular context, "void structure" refers to an absence of the conductive material of conductor portion 541 (e.g., wherein a fluid phase material is in the void structure).

Figure 7:
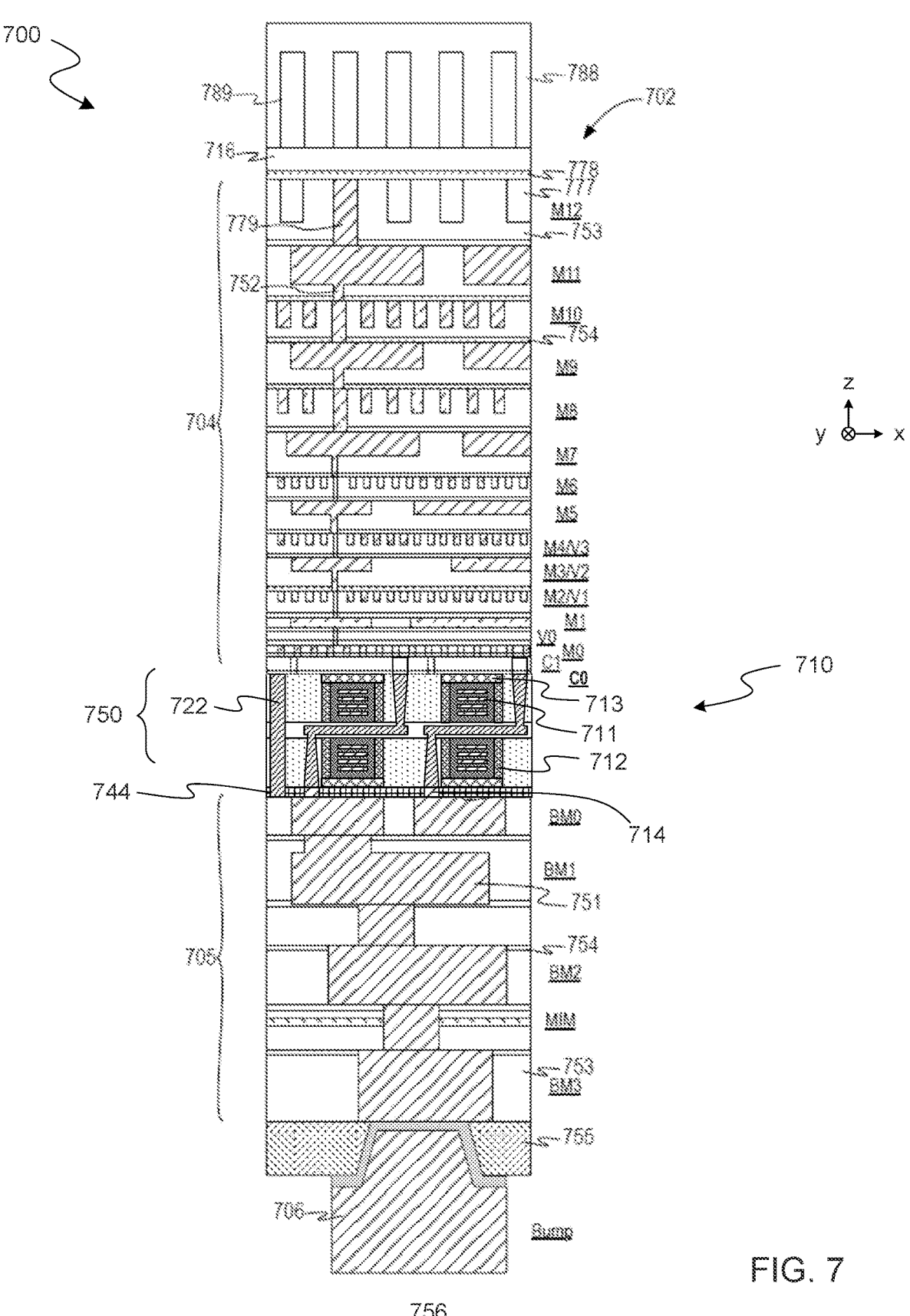
FIG. 7 illustrates a cross-sectional view of a low-temperature, integrated circuit (IC) system using die- and package-level active cooling according to an embodiment.

FIG. 7 illustrates a cross-sectional view of a low-temperature, IC system 700 which includes interconnect structures extending between channel stack structures, and which uses die- and package-level active cooling, in accordance with some embodiments. In the example of IC system 700, IC die 702 includes active-cooling structures or components as provided by both die-level microchannels 777 and package-level active-cooling structure 788. IC system 700 includes a lateral surface along the x-y plane that may be defined or taken at any vertical position of IC system 700. The lateral surface of the x-y plane is orthogonal to a vertical or build-up dimension as defined by the z-axis. In some embodiments, IC system 700 may be formed from any substrate material suitable for the fabrication of transistor circuitry. In some embodiments, a semiconductor substrate is used to manufacture access transistors 710 and other transistors and components of IC system 700. The semiconductor substrate may include a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as gallium arsenide. The substrate may also include semiconductor materials, metals, dielectrics, dopants, and other materials commonly found in semiconductor substrates.

In FIG. 7, IC system 700 includes an IC die 702, which is a monolithic IC with a functional layer between stacked channel structures as described above, including access transistors 710, front-side metallization layers 704 (or front-side interconnect layers), and optional back-side metallization layers 705 (or back-side interconnect layers). As shown, access transistors 710 are non-planar transistors embedded within one or more layers 750. As shown, each of access transistors 710 include channel regions 711 (e.g., nanoribbons or nanosheets), gate structures 712, and gate contacts 713. Each of access transistors 710 also include source and drain structures, and source and drain contacts, which are not shown in the cross-section of FIG. 7. In some embodiments, front-side metallization layers 704 (including vertical metallization structures 722) provide signal routing to access transistors 710 and back-side metallization layers 705 provide power delivery, as enabled by through-contacts 714, to access transistors 710. In some embodiments, IC system 700 further includes a package-level cooling structure 788, which may be deployed on or over front-side metallization layers 704 (as shown) or on or over a back-side of IC die 702. In some embodiments, package-level cooling structure 788 is coupled to IC die 702 by an adhesion layer 716. IC system 700 may also be deployed without back-side metallization layers 705 shown in FIG. 7. In such embodiments, signal routing and power are provided to access transistors 710 via front-side metallization layers 704. However, use of back-side metallization layers 705 may offer advantages.

Access transistors 710 are connected and thermally coupled by metallization, e.g., metal heat spreader 744, to the entire metallization structure by through-contacts 714. In this way, access transistors 710 are thermally coupled to both the die-level active-cooling structures (of die-level microchannels 777) and package-level active-cooling structure 788.

Interconnectivity of access transistors 710 (and other transistors, etc.), signal routing in a separation layer between channel stack structures, and routing to an outside device (not shown), is provided by front-side metallization layers 704, optional back-side metallization layers 705, and package-level interconnects 706. In the example of FIG. 7, package-level interconnects 706 are provided on or over a back-side of IC die 702 as bumps over a passivation layer 755, and IC system 700 is attached to substrate 756 (and coupled to signal routing to, power delivery, etc.) by package-level interconnects 706. However, package-level interconnects 706 may be provided using any suitable interconnect structures such as bond pads, solder bumps, etc. Furthermore, in some embodiments, package-level interconnects 706 are provided on or over a front-side of IC die 702 (i.e., over front-side metallization layers 704) and package-level cooling structure 788 is provided on or over a back-side of IC die 702 (i.e., adjacent access transistors 710).

In IC system 700, IC die 702 includes die-level, active-cooling as provided by die-level microchannels 777. Die-level microchannels 777 are to convey a heat transfer fluid therein to remove heat from IC die 702. The heat transfer fluid may be any suitable liquid or gas. In some embodiments, the heat transfer fluid is liquid nitrogen operable to lower the temperature of IC die 702 to a temperature at or below about −196° C. In some embodiments, the heat transfer fluid is a fluid with a cryogenic temperature operating window (e.g., about −180° C. to about −70° C.). In some embodiments, the heat transfer fluid is one of helium-3, helium-4, hydrogen, neon, air, fluorine, argon, oxygen, or methane.

As used herein, the term "microchannels" indicates a channel to convey a heat transfer fluid with the multiple microchannels providing discrete separate channels or a network of channels. Notably, the plural microchannels does not indicate separate channel networks are needed. Such die-level microchannels 777 may be provided in any pattern in the x-y plane such as serpentine patterns, patterns of multiple parallel die-level microchannels 777, or the like. Die-level microchannels 777 couple to a heat exchanger (not shown) that removes heat from and cools the heat transfer fluid before re-introduction to die-level microchannels 777. The flow of fluid within die-level microchannels 777 may be provided by a pump or other fluid flow device. The operation of the heat exchanger, pump, etc. may be controlled by a controller.

In the illustrated embodiment, die-level microchannels 777 are implemented at metallization level M12. In other embodiments, die-level microchannels 777 are implemented over metallization level M12. Die-level microchannels 777 may be formed using any suitable technique or techniques such as patterning and etch techniques to form the void structures of die-level microchannels 777 and passivation or deposition techniques to form a cover structure 778 to enclose the void structures. As shown, in some embodiments, the die-level, active-cooling structure of IC system 700 includes a number of die-level microchannels 777 in IC die 702 and over a number of front-side metallization layers 704. As discussed, die-level microchannels 777 are to convey a heat transfer fluid therein. In some embodiments, a metallization feature 779 of metallization layer M12 is laterally adjacent to die-level microchannels 777. For example, metallization feature 779 may couple to a package-level interconnect structure (not shown) for signal routing for IC die 702. In some embodiments, a passive heat removal device such as a heat sink or the like may be used instead of or in addition to package-level cooling structure 788. In some embodiments, package-level cooling structure 788 is not deployed in IC system 700.

As used herein, the term "metallization layer" describes layers with interconnections or wires that provide electrical routing, generally formed of metal or other electrically and thermally conductive material. Adjacent metallization layers may be formed of different materials and by different methods. Adjacent metallization layers, such as metallization interconnects 751, are interconnected by vias, such as vias 752, that may be characterized as part of the metallization layers or between the metallization layers. As shown, in some embodiments, front-side metallization layers 704 are formed over and immediately adjacent access transistors 710. The back-side is then the opposite side, which may be exposed during processing by attaching the front-side to a carrier wafer and exposing the back-side (e.g., by back-side grind or etch operations) as known in the art.

In the illustrated example, front-side metallization layers 704 include M0, V0, M1, M2/V1, M3/V2, M4/V3, and M4-M12. However, front-side metallization layers 704 may include any number of metallization layers such as eight or more metallization layers. Similarly, back-side metallization layers 705 include BM0, BM1, BM2, and BM3. However, back-side metallization layers 705 may include any number of metallization layers such as two to five metallization layers. Front-side metallization layers 704 and back-side metallization layers 705 are embedded within dielectric materials 753, 754. Furthermore, optional metal-insulator-metal (MIM) devices such as diode devices may be provided within back-side metallization layers 705. Other devices such as capacitive memory devices may be provided within front-side metallization layers 704 and/or back-side metallization layers 705.

IC system 700 includes package-level active-cooling structure 788 having package-level microchannels 789. Package-level microchannels 789 are to convey a heat transfer fluid therein to remove heat from IC die 702. The heat transfer fluid may be any suitable liquid or gas as discussed with respect to die-level microchannels 777. Package-level microchannels 789 may be provided in any pattern in the x-y plane such as serpentine patterns, patterns of multiple parallel package-level microchannels 789, etc. Package-level microchannels 789 couple to a heat exchanger (not shown) that removes heat from and cools the heat transfer fluid before re-introduction to package-level microchannels 789. The flow of fluid within package-level microchannels 789 may be provided by a pump or other fluid-flow device. The operation of the heat exchanger, pump, etc. may be controlled by a controller. In the illustrated embodiment, package-level active-cooling structure 788 is a chiller mounted to IC die 702 such that the chiller has a solid body having microchannels therein to convey a heat transfer fluid.

In some embodiments, the heat-removal fluid deployed in die-level microchannels 777 and package-level active-cooling structure 788 are coupled to the same pump and heat exchanger systems. In such embodiments, the heat removal fluid conveyed in both die-level microchannels 777 and package-level active-cooling structure 788 are the same material. Such embodiments may advantageously provide simplicity. In other embodiments, the heat removal fluids are controlled separately. In such embodiments, the heat removal fluids conveyed by die-level microchannels 777 and package-level active-cooling structure 788 may be the same or they may be different. Such embodiments may advantageously provide improved flexibility.

As discussed, IC system 700 includes IC die 702 and optional die-level and package-level active-cooling structures operable to remove heat from IC die 702 to achieve a very low operating temperature of IC die 702. As used herein, the term "very low operating temperature" indicates a temperature at or below 0° C., although even lower temperatures such as an operating temperature at or below −50° C., an operating temperature at or below −70° C., an operating temperature at or below −100° C., an operating temperature at or below −180° C., or an operating temperature at or below −196° C. may be used. In some embodiments, the operating temperature is in a cryogenic temperature operating window (e.g., about −180° C. to about −70° C.). The active-cooling structure may be provided as a package-level structure (i.e., separable from IC die 702), as a die-level structure (i.e., integral to IC die 702), or both. In some embodiments, IC die 702 is deployed in a cold environment, formed using sufficiently conductive materials, etc. and an active-cooling structure is not used.

Figure 8:
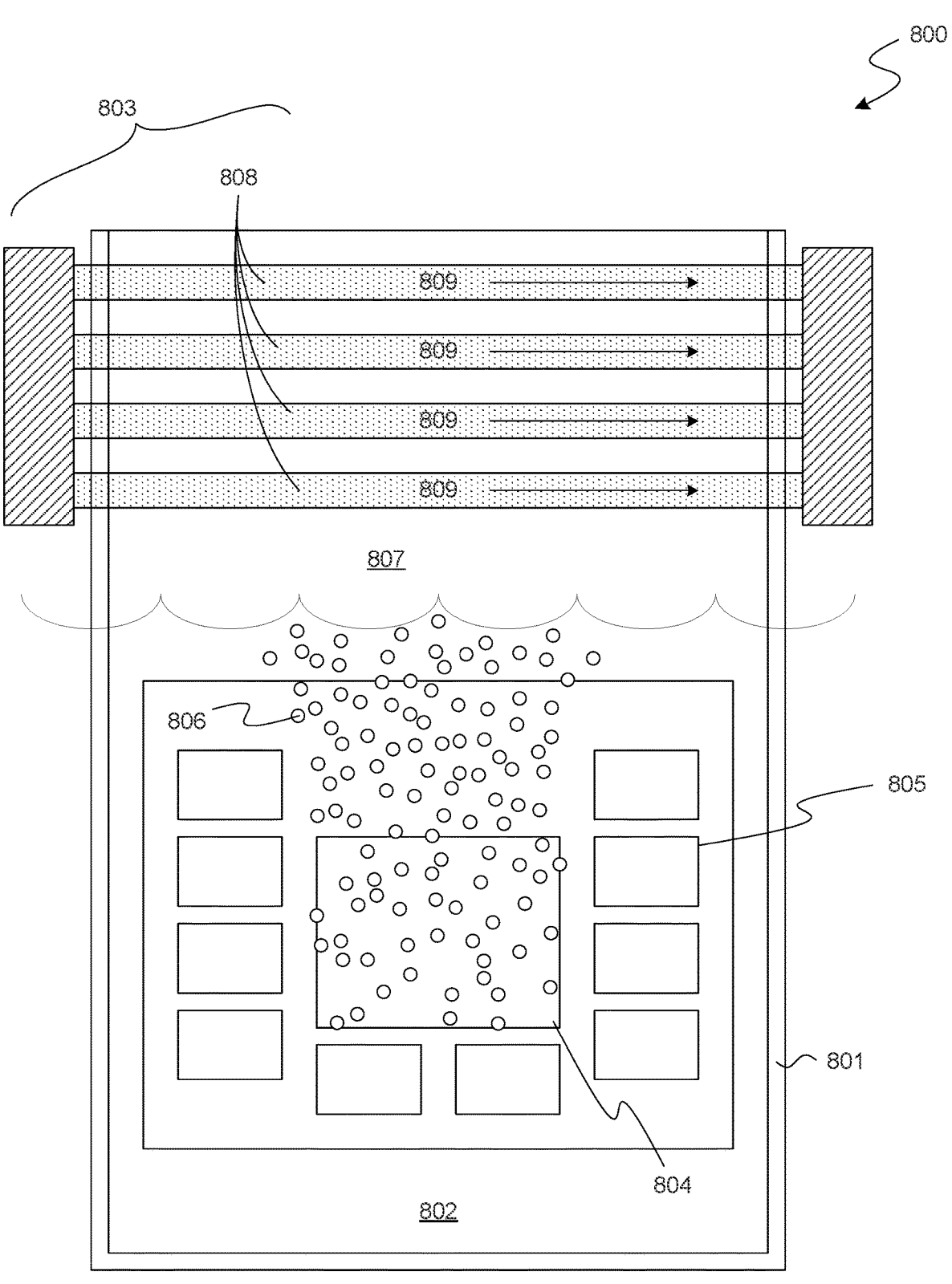
FIG. 8 illustrates a view of an example two-phase immersion cooling system for low-temperature operation of an IC die according to an embodiment.

FIG. 8 illustrates a view of an example two-phase immersion cooling system 800 for low-temperature operation of an IC die, in accordance with some embodiments. As shown, two-phase immersion cooling system 800 includes a fluid containment structure 801, a low-boiling point liquid 802 within fluid containment structure 801, and a condensation structure 803 at least partially within fluid containment structure 801. As used herein, the term "low-boiling point liquid" indicates a liquid having a boiling point in the very low temperature ranges discussed. In some embodiments, the low-boiling point liquid is one of helium-3, helium-4, hydrogen, neon, air, fluorine, argon, oxygen, or methane.

In operation, a heat generation source 804, such as an IC package including any of IC dies 100, 400, 500, 600 as discussed herein, is immersed in low-boiling point liquid 802. In some embodiments, any of IC dies 100, 400, 500, 600 as deployed in two-phase immersion cooling system 800 do not include additional active cooling structures, although such die-level or package-level active cooling structures may be used in concert with two-phase immersion cooling system 800.

In some embodiments, when deployed in two-phase immersion cooling system 800, package-level active-cooling structure 788 is a heat sink, a heat dissipation plate, a porous heat dissipation plate or the like. Notably, IC die 702 (or any of IC dies 100, 400, 500, 600), is the source of heat in the context of two-phase immersion cooling system 800. For example, IC die 702 may be packaged and mounted on electronics substrate 805. Electronic substrate 805 may be coupled to a power supply (not shown) and may be partially or completely submerged in low-boiling point liquid 802.

In operation, the heat produced by heat generation source 804 vaporizes low-boiling point liquid 802 as shown in vapor or gas state as bubbles 806, which may collect, due to gravitational forces, above low-boiling point liquid 802 as a vapor portion 807 within fluid containment structure 801. Condensation structure 803 may extend through vapor portion 807. In some embodiments, condensation structure 803 is a heat exchanger having a number of tubes 808 with a cooling fluid (i.e., a fluid colder than the condensation point of vapor portion 807) shown by arrows 809 that may flow through tubes 808 to condense vapor portion 807 back to low-boiling point liquid 802. In the IC system of FIG. 8, package-level active-cooling structure 788 includes a passive cooling structure such as a heat sink for immersion in low-boiling point liquid 802.

FIG. 9 illustrates features of a method 900 which, according to an embodiment, is to provide an IC comprising an interconnect that extends between two channel stack structures. Method 900 illustrates various embodiments wherein structures of a first transistor—e.g., the structures including a first one or more channel structures and a first one or more gate dielectric structures—are formed on a first side of a separation layer. In one such embodiment, structures of a second transistor—e.g., the structures including a second one or more channel structures and a second one or more gate dielectric structures—are further formed on a second side of the separation layer. Furthermore, a sacrificial material in etched from the separation layer, and replaced with a conductive material to form, at least in part, an interconnect which extends between, and across a span of, the first and second transistors. In various embodiments, method 900 provides structures of one of IC dies 100, 400, 500, 600—e.g., wherein method 900 includes or is otherwise based on processing such as that illustrated by stages 200-207 (or by stages 300-305).

As shown in FIG. 9, method 900 comprises (at 901) receiving a separation layer which comprises a sacrificial material—e.g., wherein the separation layer is separation layer 210 (or separation layer 310), and wherein the sacrificial material is sacrificial material 211 (or sacrificial material 311). Method 900 further comprises (at 902) forming a first channel stack structure at a first surface of the separation layer. For example, the forming at 902 comprises any of various combinations of additive processes and subtractive processes which fabricate channel stack structure 250 or channel stack structure 350 from a first superlattice that comprises alternating active layers and buffer layers.

During or after such forming of the first channel stack structure, method 900 (at 903) forms first source or drain (SD) structures each at a respective side of the first channel stack structure. For example, in various embodiments, the first channel stack structure comprises first channel structures and first dielectric structures (e.g., first gate dielectrics) which each extend between a respective two of the first channel structures. In one such embodiment, the first SD structures are at respective ends of the first channel structures—e.g., wherein the first channel structures are each coupled to, and configured to conduct current between, the first SD structures.

Method 900 further comprises (at 904) forming a second channel stack structure at a second surface of the separation layer—e.g., wherein the second surface is opposite the first surface. For example, the forming at 904 comprises any of various combinations of processes which fabricate channel stack structure 260 or channel stack structure 360 from a second superlattice that similarly comprises alternating active layers and buffer layers.

During or after such forming of the second channel stack structure, method 900 (at 905) forms second SD structures each at a respective side of the second channel structures. For example, in various embodiments, the second channel stack structure comprises second channel structures and second dielectric structures (e.g., second gate dielectrics) which each extend between a respective two of the second channel structures. In one such embodiment, the second SD structures are at respective ends of the second channel structures—e.g., wherein the second channel structures are each coupled to, and configured to conduct current between, the second SD structures.

Method 900 further comprises (at 906) forming an interconnect structure which comprises a via portion, and a trace portion (such as one of via portions 142, 143, and trace portion 141), wherein the trace portion extends, within the separation layer, between the first channel stack structure and the second channel stack structure. For example, the trace portion extends in the separation layer across a horizontal span of the first channel stack structure and the second channel stack structure—e.g., across a region where the one of first channel stack structure or the second channel stack structure overlaps the other. In one such embodiment, forming the interconnect comprises replacing the sacrificial material with a conductive material of the trace portion—e.g., by performing an etch, through a hole structure formed in the insulation material, to remove the sacrificial material from an interior region of the separation layer.

Figure 10:
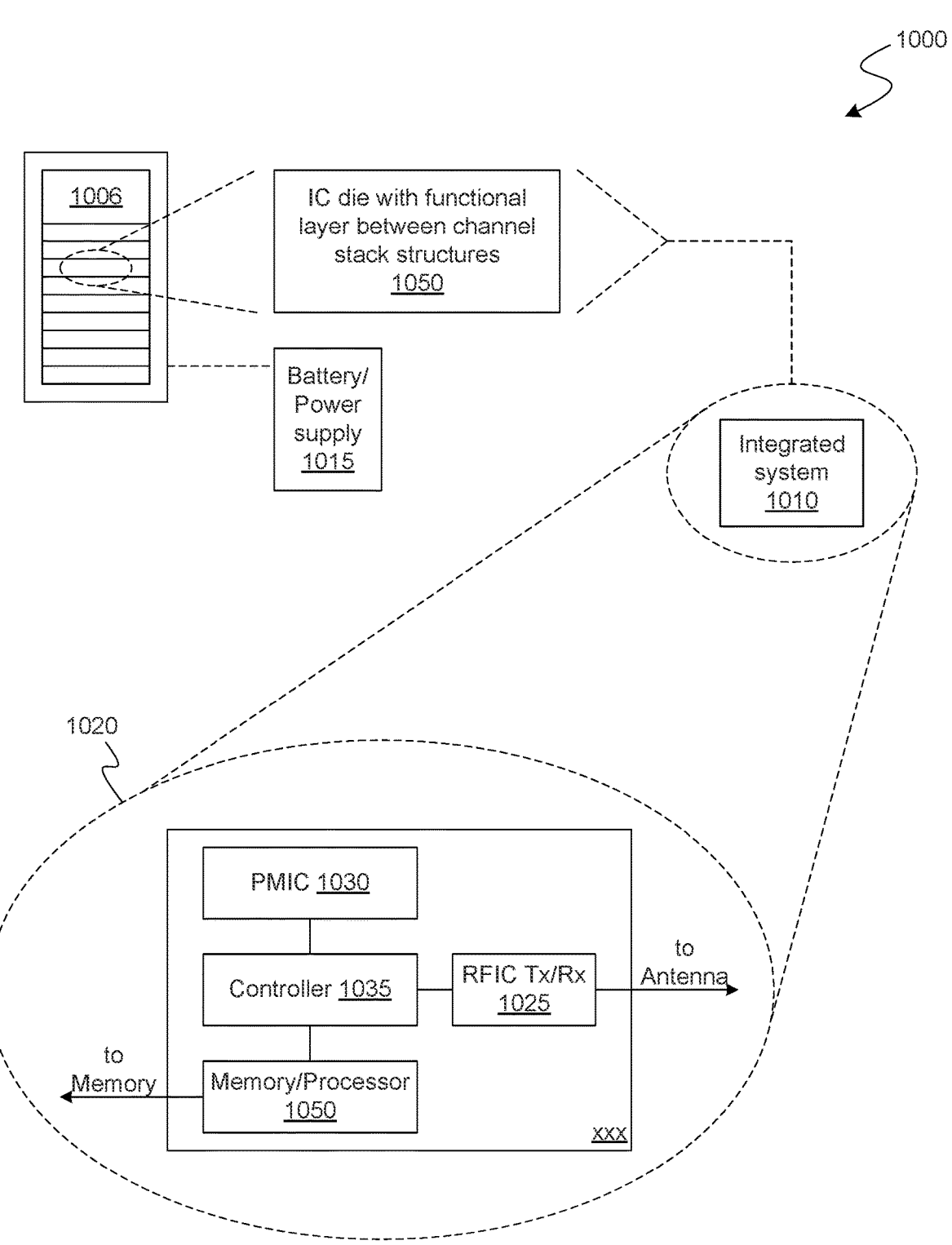
FIG. 10 illustrates a diagram of an example data server machine employing an IC die with functional metallization layer between channel stack structures according to an embodiment.

FIG. 10 illustrates a diagram of an example data server machine 1006 employing an IC die comprising a functional layer with an interconnect structure which extends between channel stack structures, in accordance with some embodiments. Server machine 1006 may be any commercial server, for example, including any number of high-performance computing platforms disposed within a rack and networked together for electronic data processing, which in the exemplary embodiment includes one or more devices 1050 each having a functional layer with an interconnect structure which extends between channel stack structures.

Also as shown, server machine 1006 includes a battery and/or power supply 1015 to provide power to devices 1050, and to provide, in some embodiments, power delivery functions such as power regulation. Devices 1050 may be deployed as part of a package-level integrated system 1010. Integrated system 1010 is further illustrated in the expanded view 1020. In the exemplary embodiment, devices 1050 (labeled "Memory/Processor") includes at least one memory chip (e.g., RAM), and/or at least one processor chip (e.g., a microprocessor, a multi-core microprocessor, or graphics processor, or the like) having the characteristics discussed herein. In an embodiment, device 1050 is a microprocessor including an SRAM cache memory. As shown, device 1050 may be a multi-chip module employing one or more IC dies each comprising a functional layer with an interconnect structure which extends between channel stack structures, as discussed herein. Device 1050 may be further coupled to (e.g., communicatively coupled to) a board, an interposer, or a substrate 110 along with, one or more of a power management IC (PMIC) 1030, RF (wireless) IC (RFIC) 1025, including a wideband RF (wireless) transmitter and/or receiver (TX/RX) (e.g., including a digital baseband and an analog front end module further comprises a power amplifier on a transmit path and a low noise amplifier on a receive path), and a controller 1035 thereof. In some embodiments, RFIC 1025, PMIC 1030, controller 1035, and device 1050 include one or more IC dies, each having a functional layer with an interconnect structure which extends between channel stack structures, on substrate 756 in a multi-chip module.

Figure 11:
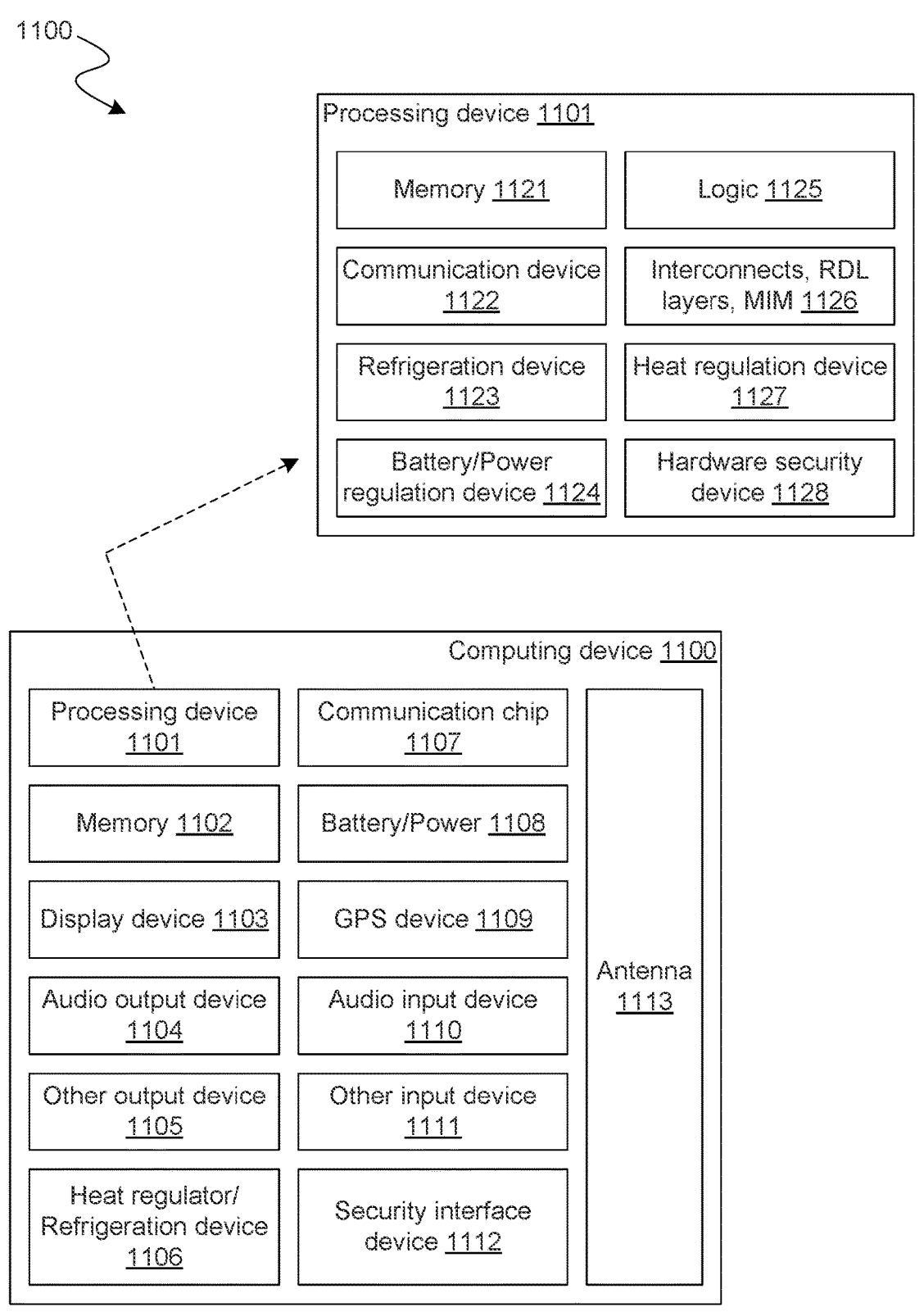
FIG. 11 is a block diagram of an example computing device according to an embodiment.

FIG. 11 is a block diagram of an example computing device 1100, in accordance with some embodiments. For example, one or more components of computing device 1100 may include any of the devices or structures discussed herein. A number of components are illustrated in FIG. 11 as being included in computing device 1100, but any one or more of these components may be omitted or duplicated, as suitable for the application. In some embodiments, some or all of the components included in computing device 1100 may be attached to one or more printed circuit boards (e.g., a motherboard). In some embodiments, various ones of these components may be fabricated onto a single system-on-a-chip (SoC) die. Additionally, in various embodiments, computing device 1100 may not include one or more of the components illustrated in FIG. 11, but computing device 1100 may include interface circuitry for coupling to the one or more components. For example, computing device 1100 may not include a display device 1103, but may include display device interface circuitry (e.g., a connector and driver circuitry) to which display device 1103 may be coupled. In another set of examples, computing device 1100 may not include an audio output device 1104, other output device 1105, global positioning system (GPS) device 1109, audio input device 1110, or other input device 1111, but may include audio output device interface circuitry, other output device interface circuitry, GPS device interface circuitry, audio input device interface circuitry, audio input device interface circuitry, to which audio output device 1104, other output device 1105, GPS device 1109, audio input device 1110, or other input device 1111 may be coupled.

Computing device 1100 may include a processing device 1101 (e.g., one or more processing devices). As used herein, the term "processing device" or "processor" indicates a device that processes electronic data from registers and/or memory (such as SRAM) to transform that electronic data into other electronic data that may be stored in registers and/or memory (e.g., SRAM). Processing device 1101 may include a memory 1121 (itself including SRAM), a communication device 1122, a refrigeration device 1123, a battery/power regulation device 1124, logic 1125, interconnects 1126 (i.e., optionally including redistribution layers (RDL) or metal-insulator-metal (MIM) devices), a heat regulation device 1127, and a hardware security device 1128. Processing device 1101 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices.

Computing device 1100 may include a memory 1102, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 1102 includes memory that shares a die with processing device 1101. This memory may be used as cache memory and may include embedded dynamic random-access memory (eDRAM) or spin transfer torque magnetic random-access memory (STT-M RAM).

Computing device 1100 may include a heat regulation/refrigeration device 1106. Heat regulation/refrigeration device 1106 may maintain processing device 1101 (and/or other components of computing device 1100) at a predetermined low temperature during operation. This predetermined low temperature may be any temperature discussed herein.

In some embodiments, computing device 1100 may include a communication chip 1107 (e.g., one or more communication chips). For example, the communication chip 1107 may be configured for managing wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 1107 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16 2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 1107 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 1107 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 1107 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 1107 may operate in accordance with other wireless protocols in other embodiments. Computing device 1100 may include an antenna 1113 to facilitate wireless communications and/or to receive other wireless communications (such as AM or FM radio transmissions).

In some embodiments, communication chip 1107 may manage wired communications, such as electrical, optical, or any other suitable communication protocols (e.g., the Ethernet). As noted above, communication chip 1107 may include multiple communication chips. For instance, a first communication chip 1107 may be dedicated to shorter-range wireless communications such as Wi-Fi or Bluetooth, and a second communication chip 1107 may be dedicated to longer-range wireless communications such as GPS, EDGE, GPRS, CDMA, WiMAX, LTE, EV-DO, or others. In some embodiments, a first communication chip 1107 may be dedicated to wireless communications, and a second communication chip 1107 may be dedicated to wired communications.

Computing device 1100 may include battery/power circuitry 1108. Battery/power circuitry 1108 may include one or more energy storage devices (e.g., batteries or capacitors) and/or circuitry for coupling components of computing device 1100 to an energy source separate from computing device 1100 (e.g., AC line power).

Computing device 1100 may include a display device 1103 (or corresponding interface circuitry, as discussed above). Display device 1103 may include any visual indicators, such as a heads-up display, a computer monitor, a projector, a touchscreen display, a liquid crystal display (LCD), a light-emitting diode display, or a flat panel display, for example.

Computing device 1100 may include an audio output device 1104 (or corresponding interface circuitry, as discussed above). Audio output device 1104 may include any device that generates an audible indicator, such as speakers, headsets, or earbuds, for example.

Computing device 1100 may include an audio input device 1110 (or corresponding interface circuitry, as discussed above). Audio input device 1110 may include any device that generates a signal representative of a sound, such as microphones, microphone arrays, or digital instruments (e.g., instruments having a musical instrument digital interface (MIDI) output).

Computing device 1100 may include a GPS device 1109 (or corresponding interface circuitry, as discussed above). GPS device 1109 may be in communication with a satellite-based system and may receive a location of computing device 1100, as known in the art.

Computing device 1100 may include other output device 1105 (or corresponding interface circuitry, as discussed above). Examples of the other output device 1105 may include an audio codec, a video codec, a printer, a wired or wireless transmitter for providing information to other devices, or an additional storage device.

Computing device 1100 may include other input device 1111 (or corresponding interface circuitry, as discussed above). Examples of the other input device 1111 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 1100 may include a security interface device 1112. Security interface device 1112 may include any device that provides security measures for computing device 1100 such as intrusion detection, biometric validation, security encode or decode, access list management, malware detection, or spyware detection.

Computing device 1100, or a subset of its components, may have any appropriate form factor, such as a hand-held or mobile computing device (e.g., a cell phone, a smart phone, a mobile internet device, a music player, a tablet computer, a laptop computer, a netbook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

Numerous details are described herein to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In one or more first embodiments, an integrated circuit (IC) comprises a separation layer, a first source or drain (SD) structure and a second SD structure, a first channel stack structure at a first surface of the separation layer, the first channel stack structure comprising first channel structures which extend between the first SD structure and the second SD structure, a third SD structure and a fourth SD structure, a second channel stack structure at a second surface of the separation layer, the second channel stack structure comprising second channel structures which extend between the third SD structure and the fourth SD structure, and an interconnect structure comprising a via portion which extends into the separation layer, and a trace portion within the separation layer, and between the first channel stack structure and the second channel stack structure.

In one or more second embodiments, further to the first embodiment, the interconnect structure comprises a contiguous body of a conductive material, wherein the contiguous body extends to form respective parts of the trace portion and the via portion, in a region where the trace portion meets the via portion, a liner structure extends around the contiguous body.

In one or more third embodiments, further to the second embodiment, in the trace portion, the contiguous body forms one of a seam structure or a void structure.

In one or more fourth embodiments, further to the second embodiment, the via portion is a first via portion which extends into the separation layer at the first surface, the interconnect structure further comprises a second via portion which extends into the separation layer at either of the first surface or the second surface, and the trace portion extends across a span of the first channel stack structure and the second channel stack structure to each one of the first via portion of the second via portion.

In one or more fifth embodiments, further to the third embodiment, the contiguous body further extends to form a respective part of the second via portion, and in another region where the trace portion meets the second via portion, the liner structure extends around the contiguous body.

In one or more sixth embodiments, further to the third embodiment, the conductive material is a first conductive material, and the liner structure is a first liner structure, the second via portion comprises a second contiguous body of a second conductive material, a second liner structure extends around the second contiguous body, and one of the first liner structure or the second liner structure extends between the first contiguous body and the second contiguous body.

In one or more seventh embodiments, further to the first embodiment or the second embodiment, the first channel structures are arranged along a direction which is perpendicular to the first surface.

In one or more eighth embodiments, further to the first embodiment or the second embodiment, the via portion is a first via portion which extends into the separation layer at the first surface, the interconnect structure further comprises a second via portion which extends into the separation layer at either of the first surface or the second surface, and the trace portion extends across a span of the first channel stack structure and the second channel stack structure to each one of the first via portion of the second via portion.

In one or more ninth embodiments, further to the first embodiment or the second embodiment, a thickness of the the trace portion is in a range of 0.5 nanometers (nm) to 20 nm.

In one or more tenth embodiments, further to the first embodiment or the second embodiment, the first channel structures comprise nanowires or nanoribbons.

In one or more eleventh embodiments, a system comprises a substrate, a power supply, and an integrated circuit (IC) die attached to the substrate and coupled to the power supply, the IC die comprising a separation layer, a first source or drain (SD) structure and a second SD structure, a first channel stack structure at a first surface of the separation layer, the first channel stack structure comprising first channel structures which extend between the first SD structure and the second SD structure, a third SD structure and a fourth SD structure, a second channel stack structure at a second surface of the separation layer, the second channel stack structure comprising second channel structures which extend between the third SD structure and the fourth SD structure, and an interconnect structure comprising a via portion which extends into the separation layer, and a trace portion within the separation layer, and between the first channel stack structure and the second channel stack structure.

In one or more twelfth embodiments, further to the eleventh embodiment, the interconnect structure comprises a contiguous body of a conductive material, wherein the contiguous body extends to form respective parts of the trace portion and the via portion, in a region where the trace portion meets the via portion, a liner structure extends around the contiguous body.

In one or more thirteenth embodiments, further to the twelfth embodiment, in the trace portion, the contiguous body forms one of a seam structure or a void structure.

In one or more fourteenth embodiments, further to the twelfth embodiment, the via portion is a first via portion which extends into the separation layer at the first surface, the interconnect structure further comprises a second via portion which extends into the separation layer at either of the first surface or the second surface, and the trace portion extends across a span of the first channel stack structure and the second channel stack structure to each one of the first via portion of the second via portion.

In one or more fifteenth embodiments, further to the fourteenth embodiment, the contiguous body further extends to form a respective part of the second via portion, and in another region where the trace portion meets the second via portion, the liner structure extends around the contiguous body.

In one or more sixteenth embodiments, further to the fourteenth embodiment, the conductive material is a first conductive material, and the liner structure is a first liner structure, the second via portion comprises a second contiguous body of a second conductive material, a second liner structure extends around the second contiguous body, and one of the first liner structure or the second liner structure extends between the first contiguous body and the second contiguous body.

In one or more seventeenth embodiments, further to the eleventh embodiment or the twelfth embodiment, the first channel structures are arranged along a direction which is perpendicular to the first surface.

In one or more eighteenth embodiments, further to the eleventh embodiment or the twelfth embodiment, the via portion is a first via portion which extends into the separation layer at the first surface, the interconnect structure further comprises a second via portion which extends into the separation layer at either of the first surface or the second surface, and the trace portion extends across a span of the first channel stack structure and the second channel stack structure to each one of the first via portion of the second via portion.

In one or more nineteenth embodiments, further to the eleventh embodiment or the twelfth embodiment, a thickness of the the trace portion is in a range of 0.5 nanometers (nm) to 20 nm.

In one or more twentieth embodiments, further to the eleventh embodiment or the twelfth embodiment, the system comprises, or is thermally coupled to, a cooling structure, the cooling structure operable to remove heat from an IC die to achieve an operating temperature at or below −25° C.

In one or more twenty-first embodiments, further to the eleventh embodiment or the twelfth embodiment, the first channel structures comprise nanowires or nanoribbons.

In one or more twenty-second embodiments, a method of fabricating an integrated circuit comprises receiving a separation layer which comprises a sacrificial material, forming, at a first surface of the separation layer, a first one or more channel structures and a first one or more gate dielectric structures, forming a first source or drain (SD) structure and a second SD structure at respective ends of the first one or more channel structures, forming, at a second surface of the separation layer, a second one or more channel structures and a second one or more gate dielectric structures, forming a third SD structure and a fourth SD structure at respective ends of the second one or more channel structures, forming an interconnect structure which comprises a via portion, and a trace portion which extends, within the separation layer, from the via portion and between the first one or more channel structures and the second one or more channel structures, wherein forming the interconnect comprises replacing the sacrificial material with a conductive material of the trace portion.

In one or more twenty-third embodiments, further to the twenty-second embodiment, forming the interconnect structure comprises forming a contiguous body of a conductive material, wherein the contiguous body extends to form respective parts of the trace portion and the via portion, and wherein, in a region where the trace portion meets the via portion, a liner structure extends around the contiguous body.

In one or more twenty-fourth embodiments, further to the twenty-third embodiment, in the trace portion, the contiguous body forms one of a seam structure or a void structure.

In one or more twenty-fifth embodiments, further to the twenty-third embodiment, the via portion is a first via portion which extends into the separation layer at the first surface, wherein forming the interconnect structure further comprises forming a second via portion which extends into the separation layer at either of the first surface or the second surface, and wherein the trace portion extends across a span of the first one or more channel structures and the second one or more channel structures to each one of the first via portion of the second via portion.

In one or more twenty-sixth embodiments, further to the twenty-fifth embodiment, the contiguous body further extends to form a respective part of the second via portion, and in another region where the trace portion meets the second via portion, the liner structure extends around the contiguous body.

In one or more twenty-seventh embodiments, further to the twenty-fifth embodiment, the conductive material is a first conductive material, and the liner structure is a first liner structure, the second via portion comprises a second contiguous body of a second conductive material, a second liner structure extends around the second contiguous body, and one of the first liner structure or the second liner structure extends between the first contiguous body and the second contiguous body.

In one or more twenty-eighth embodiments, further to the twenty-second embodiment or the twenty-third embodiment, the first one or more channel structures are arranged along a direction which is perpendicular to the first surface.

In one or more twenty-ninth embodiments, further to the twenty-second embodiment or the twenty-third embodiment, the via portion is a first via portion which extends into the separation layer at the first surface, wherein forming the interconnect structure further comprises forming a second via portion which extends into the separation layer at either of the first surface or the second surface, and wherein the trace portion extends across a span of the first one or more channel structures and the second one or more channel structures to each one of the first via portion of the second via portion.

In one or more thirtieth embodiments, further to the twenty-second embodiment or the twenty-third embodiment, a thickness of the trace portion is in a range of 0.5 nanometers (nm) to 20 nm.

In one or more thirty-first embodiments, further to the twenty-second embodiment or the twenty-third embodiment, the first one or more channel structures comprise nanowires or nanoribbons.

Techniques and architectures for providing interconnect structures between channel stack structures are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) comprising:
a separation layer;
a first source or drain (SD) structure and a second SD structure;
a first channel stack structure at a first surface of the separation layer, the first channel stack structure comprising first channel structures which each extend in parallel with a first horizontal line to each of the first SD structure and the second SD structure;
a third SD structure and a fourth SD structure;
a second channel stack structure at a second surface of the separation layer, the second channel stack structure comprising second channel structures which each extend in parallel with the first horizontal line to each of the third SD structure and the fourth SD structure;
a first gate structure, wherein the first channel stack structure extends through the first gate structure;
a second gate structure, wherein the second channel stack structure extends through the second gate structure; and
an interconnect structure comprising:
a via portion which extends into the separation layer; and
a trace portion within the separation layer, and between the first channel stack structure and the second channel stack structure;
wherein:
the first SD structure and the second SD structure are at opposite respective ends of a first horizontal span of the first channel stack structure;
the third SD structure and the fourth SD structure are at opposite respective ends of a second horizontal span of the second channel stack structure;
the first horizontal span and the second horizontal span are each in parallel with the first horizontal line;
in the separation layer, the trace portion extends in parallel with a second horizontal line across each of:
an entirety of a third horizontal span of the first channel stack structure and the first gate structure; and
an entirety of a fourth horizontal span of the second channel stack structure and the second gate structure; and
the second horizontal line is orthogonal to the first horizontal line.

2. The IC of claim 1, wherein:
the interconnect structure comprises a contiguous body of a conductive material, wherein the contiguous body extends to form respective parts of the trace portion and the via portion;
in a region where the trace portion meets the via portion, a liner structure extends around the contiguous body.

3. The IC of claim 2, wherein, in the trace portion, the contiguous body forms one of a seam structure or a void structure.

4. The IC of claim 2, wherein:
the via portion is a first via portion which extends into the separation layer at the first surface;
the interconnect structure further comprises a second via portion which extends into the separation layer at either of the first surface or the second surface; and the trace portion extends across the third horizontal span and the fourth horizontal span to each one of the first via portion of the second via portion.

5. The IC of claim 4, wherein:
the contiguous body further extends to form a respective part of the second via portion; and
in another region where the trace portion meets the second via portion, the liner structure extends around the contiguous body.

6. The IC of claim 4, wherein:
the contiguous body is a first contiguous body, the conductive material is a first conductive material, and the liner structure is a first liner structure;
the second via portion comprises a second contiguous body of a second conductive material;
a second liner structure extends around the second contiguous body; and
one of the first liner structure or the second liner structure extends between the first contiguous body and the second contiguous body.

7. The IC of claim 1, wherein the first channel structures are arranged along a direction which is perpendicular to the first surface.

8. The IC of claim 1, wherein:
the via portion is a first via portion which extends into the separation layer at the first surface;
the interconnect structure further comprises a second via portion which extends into the separation layer at either of the first surface or the second surface; and
the trace portion extends across the third horizontal span and the fourth horizontal span to each one of the first via portion of the second via portion.

9. The IC of claim 1, wherein:
the separation layer comprises a first contiguous body of an insulation material;
the first contiguous body extends over a top of the trace portion in a region under the first channel stack structure; and
the first contiguous body further extends under a bottom of the trace portion in a region over the second channel stack structure.

10. The IC of claim 1, wherein the first channel structures comprise nanowires or nanoribbons.

11. A system comprising:
a substrate;
a power supply; and
an integrated circuit (IC) die attached to the substrate and coupled to the power supply, the IC die comprising:
a separation layer;
a first source or drain (SD) structure and a second SD structure;
a first channel stack structure at a first surface of the separation layer, the first channel stack structure comprising first channel structures which each extend in parallel with a first horizontal line to each of the first SD structure and the second SD structure;
a third SD structure and a fourth SD structure;
a second channel stack structure at a second surface of the separation layer, the second channel stack structure comprising second channel structures which each extend in parallel with the first horizontal line to each of the third SD structure and the fourth SD structure;
a first gate structure, wherein the first channel stack structure extends through the first gate structure;

a second gate structure, wherein the second channel stack structure extends through the second gate structure; and an interconnect structure comprising:

a via portion which extends into the separation layer; and a trace portion within the separation layer, and between the first channel stack structure and the second channel stack structure;

wherein:

the first SD structure and the second SD structure are at opposite respective ends of a first horizontal span of the first channel stack structure;

the third SD structure and the fourth SD structure are at opposite respective ends of a second horizontal span of the second channel stack structure;

the first horizontal span and the second horizontal span are each in parallel with the first horizontal line;

in the separation layer, the trace portion extends in parallel with a second horizontal line across each of:

an entirety of a third horizontal span of the first channel stack structure and the first gate structure; and an entirety of a fourth horizontal span of the second channel stack structure and the second gate structure; and the second horizontal line is orthogonal to the first horizontal line.

12. The system of claim 11, wherein:

the interconnect structure comprises a contiguous body of a conductive material, wherein the contiguous body extends to form respective parts of the trace portion and the via portion;

in a region where the trace portion meets the via portion, a liner structure extends around the contiguous body.

13. The system of claim 12, wherein, in the trace portion, the contiguous body forms one of a seam structure or a void structure.

14. The system of claim 11, wherein:

the via portion is a first via portion which extends into the separation layer at the first surface;

the interconnect structure further comprises a second via portion which extends into the separation layer at either of the first surface or the second surface; and the trace portion extends across the third horizontal span and the fourth horizontal span to each one of the first via portion of the second via portion.

15. The system of claim 11, wherein the system comprises, or is thermally coupled to, a cooling structure, the cooling structure operable to remove heat from an IC die to achieve an operating temperature at or below −25° C.

* * * * *